US009698686B2

(12) United States Patent
Maki et al.

(10) Patent No.: US 9,698,686 B2
(45) Date of Patent: *Jul. 4, 2017

(54) DETECTION DEVICE, SENSOR, ELECTRONIC APPARATUS, AND MOVING OBJECT

(71) Applicant: Seiko Epson Corporation, Tokyo (JP)

(72) Inventors: Katsuhiko Maki, Chino (JP); Teppei Higuchi, Chino (JP); Takashi Nomiya, Matsumoto (JP)

(73) Assignee: Seiko Epson Corporation (JP)

( * ) Notice: Subject to any disclaimer, the term of this patent is extended or adjusted under 35 U.S.C. 154(b) by 300 days.

This patent is subject to a terminal disclaimer.

(21) Appl. No.: 14/533,483

(22) Filed: Nov. 5, 2014

(65) Prior Publication Data
US 2015/0122034 A1 May 7, 2015

(30) Foreign Application Priority Data

Nov. 7, 2013 (JP) ................................. 2013-231343

(51) Int. Cl.
*G01C 19/5776* (2012.01)
*H03G 3/30* (2006.01)
(Continued)

(52) U.S. Cl.
CPC ........ *H02M 3/158* (2013.01); *G01C 19/5776* (2013.01); *H03F 3/45183* (2013.01);
(Continued)

(58) Field of Classification Search
CPC  H02M 3/158; H03F 3/45183; H03F 3/45475; H03F 2200/261;
(Continued)

(56) References Cited

U.S. PATENT DOCUMENTS 6,125,701 A * 10/2000 Sugitani ............ G01C 19/5607
73/504.16
6,510,737 B1  1/2003 Hobbs
(Continued)

FOREIGN PATENT DOCUMENTS

JP       05-259738 A    10/1993
JP    2006-029901 A     2/2006
(Continued)

OTHER PUBLICATIONS

Sasaki et al., "Development of Three-Axis Gyroscope (Motion Sensor) for Consumer Applications", Panasonic Technical Journal, vol. 58, No. 1, p. 47-51, Apr. 2012 (and Translation).

*Primary Examiner* — J M Saint Surin
(74) *Attorney, Agent, or Firm* — Harness, Dickey & Pierce, P.L.C.

(57) ABSTRACT

A detection device includes a driving circuit which drives a physical quantity transducer, a detection circuit which detects a desired signal, a power-supply terminal into which a power-supply voltage is input, a regulator circuit which performs a voltage adjustment of stepping down the power-supply voltage from the power-supply terminal, and supplies a regulated power-supply voltage obtained by the voltage adjustment to the driving circuit and the detection circuit as an operating power-supply voltage, and a buffer circuit which is supplied with the power-supply voltage, receives a drive signal from the driving circuit, and outputs an amplified drive signal in which an amplitude of the drive signal increases to the physical quantity transducer.

20 Claims, 17 Drawing Sheets

(51) Int. Cl.
*H02M 3/158* (2006.01)
*H03F 3/45* (2006.01)

(52) U.S. Cl.
CPC ....... *H03F 3/45475* (2013.01); *H03G 3/3005* (2013.01); *H03F 2200/261* (2013.01); *H03F 2203/45212* (2013.01); *H03F 2203/45466* (2013.01); *H03F 2203/45504* (2013.01); *H03F 2203/45508* (2013.01); *H03F 2203/45528* (2013.01); *H03F 2203/45536* (2013.01); *H03F 2203/45674* (2013.01)

(58) Field of Classification Search
CPC . H03F 2203/45212; H03F 2203/45466; H03F 2203/45508; H03F 2203/45528; H03F 2203/45536; H03F 2203/45674; H03F 2203/45504; G01C 19/5776; H03G 3/3005
USPC .......................................................... 73/649
See application file for complete search history.

(56) References Cited

U.S. PATENT DOCUMENTS

| | | | |
|---|---|---|---|
| 7,210,349 B2 | 5/2007 | Kurihara et al. | |
| 7,808,334 B2* | 10/2010 | Yoshida | G01F 1/8422 310/329 |
| 7,849,744 B2 | 12/2010 | Kanai et al. | |
| 8,037,755 B2* | 10/2011 | Nagata | G01C 19/56 73/504.04 |
| 8,240,204 B2 | 8/2012 | Kanai et al. | |
| 8,327,704 B2 | 12/2012 | Sato | |
| 9,391,595 B2* | 7/2016 | Higuchi | H03K 3/011 |
| 2009/0013785 A1* | 1/2009 | Yoshida | G01C 19/56 73/514.16 |
| 2009/0133496 A1 | 5/2009 | Kanai et al. | |
| 2009/0217757 A1* | 9/2009 | Nozawa | G01C 19/5607 73/504.12 |
| 2011/0061461 A1 | 3/2011 | Yoshida | |
| 2012/0111111 A1 | 5/2012 | Murakami et al. | |
| 2012/0191398 A1 | 7/2012 | Murakami et al. | |
| 2013/0068019 A1 | 3/2013 | Takase | |
| 2014/0007645 A1 | 1/2014 | Uemura et al. | |
| 2014/0305185 A1* | 10/2014 | Maki | H03M 1/0629 73/1.37 |
| 2015/0122022 A1* | 5/2015 | Maki | G01C 19/5614 73/504.16 |
| 2015/0122035 A1* | 5/2015 | Maki | H03F 3/45183 73/649 |
| 2015/0160011 A1* | 6/2015 | Nakajima | G01C 19/5776 702/56 |
| 2015/0305206 A1* | 10/2015 | Fukuda | G11B 33/128 361/679.49 |

FOREIGN PATENT DOCUMENTS

| | | |
|---|---|---|
| JP | 2008-058305 A | 3/2008 |
| JP | 2008-099257 A | 4/2008 |

* cited by examiner

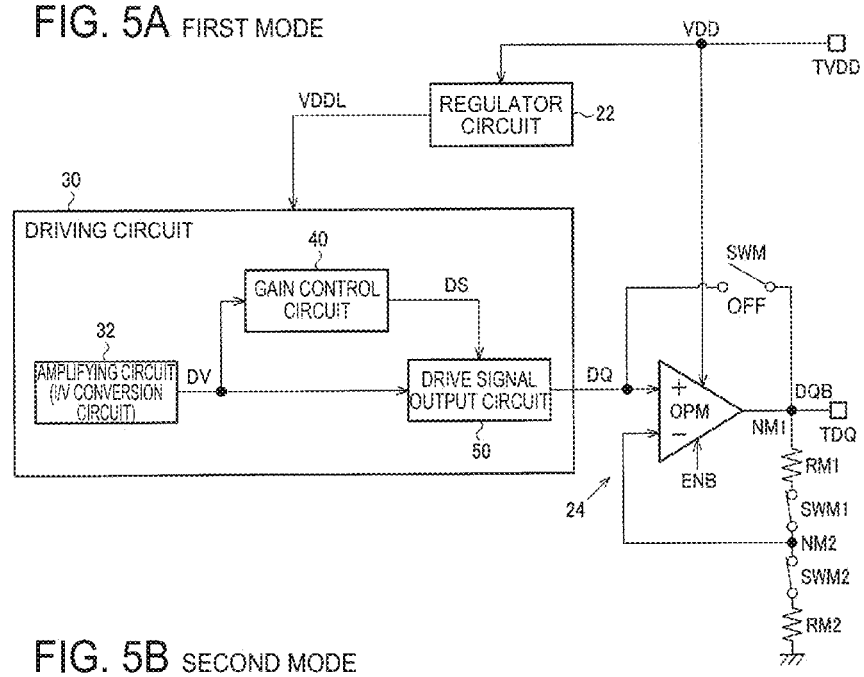
FIG. 5A FIRST MODE
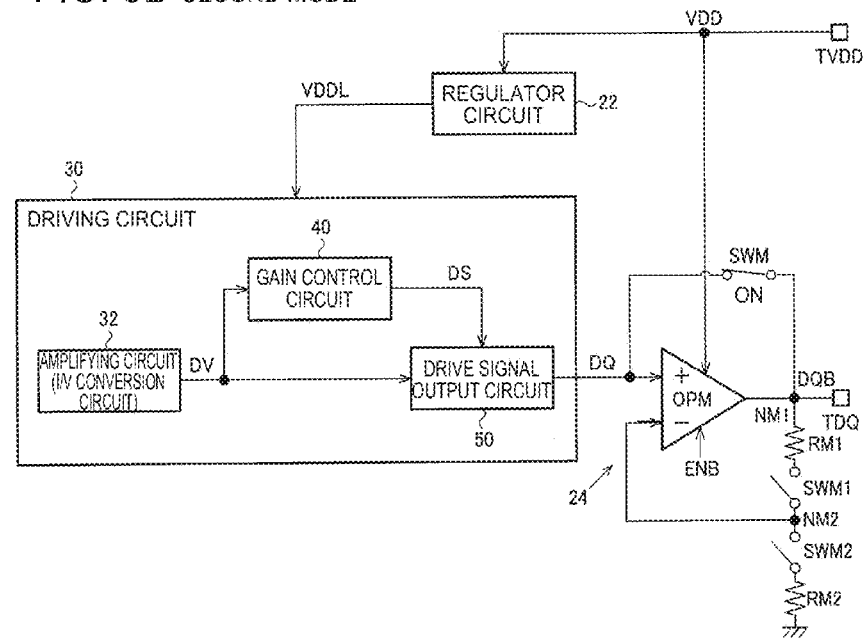
FIG. 5B SECOND MODE $$\text{IMPEDANCE MINIMUM POINT (RESONANT POINT)} = \frac{\sqrt{L^2 \times (R+RN)^2 - 4 \times L \times C} - C \times (R+RN)}{2 \times L \times C}$$

DETECTION DEVICE, SENSOR, ELECTRONIC APPARATUS, AND MOVING OBJECT

BACKGROUND

1. Technical Field

The present invention relates to a detection device, a sensor, an electronic apparatus, a moving object, and the like.

2. Related Art

In an electronic apparatus such as a digital camera, a smart phone, or a moving object such as a car or an airplane, a gyroscope sensor for detecting a physical quantity which is changed due to an external factor is embedded. Such a gyroscope sensor detects a physical quantity such as angular velocity, and is used in a so-called camera shake correction, a posture control, a GPS autonomous navigation, and the like.

As one of these gyroscope sensors, a vibrational gyroscope sensor such as a crystal piezoelectric vibrational gyroscope sensor has been known. The vibrational gyroscope sensor detects a physical quantity corresponding to Coriolis force which occurs by rotation. As a detection device of the vibrational gyroscope sensor, for example, technologies disclosed in JP-A-5-259738 and JP-A-2008-99257 have been known.

In the technology disclosed JP-A-5-259738, a boosting circuit which boosts a first power-supply voltage to a second power-supply voltage is disposed, and in a start-up period, a high second power-supply voltage is set to an operating power-supply voltage, and thus a start-up time of an oscillation circuit is shortened. However, in the method of JP-A-5-259738, it takes time to enable the boosting circuit to supply the high second power-supply voltage from a startup, and the start-up time is not sufficiently shortened.

In order to solve the problem, in the technology disclosed in JP-A-2008-99257, a method in which a detection device is operated by a low first power-supply voltage as an operating power-supply voltage first, then a first power-supply voltage is switched into a high second power-supply voltage, and then the high second power-supply voltage is switched into the low first power-supply voltage is adopted.

However, in both of the technologies disclosed in JP-A-5-259738 and JP-A-2008-99257, the start-up time is shortened by switching the entire operating power-supply voltage of the detection device. For this reason, it is difficult to realize shortening of the start-up time, improvement of a detection performance, and the like together.

SUMMARY

An advantage of some aspects of the invention is to provide a detection device, a sensor, an electronic apparatus, a moving object, and the like by which shortening of a start-up time, improvement of a detection performance, and the like are able to be realized together.

The invention can be implemented as the following aspects or embodiments.

An aspect of the invention is directed to a detection device including: a driving circuit which receives a feedback signal from a physical quantity transducer, and drives the physical quantity transducer; a detection circuit which receives a detection signal from the physical quantity transducer, and detects a desired signal; a power-supply terminal into which a power-supply voltage is input; a regulator circuit which performs a voltage adjustment of stepping down the power-supply voltage from the power-supply terminal, and supplies a regulated power-supply voltage obtained by the voltage adjustment to the driving circuit and the detection circuit as an operating power-supply voltage; and a buffer circuit which is supplied with the power-supply voltage, receives a drive signal from the driving circuit, and outputs an amplified drive signal in which an amplitude of the drive signal increases to the physical quantity transducer.

According to the aspect of the invention, the regulator circuit performs the voltage adjustment of stepping down the power-supply voltage from the power-supply terminal, and supplies the regulated power-supply voltage to the driving circuit and the detection circuit. The driving circuit and the detection circuit are operated by the regulated power-supply voltage supplied from the regulator circuit as the operating power-supply voltage. On the other hand, the power-supply voltage from the power-supply terminal is supplied to the buffer circuit, and the drive signal from the driving circuit is input into the buffer circuit. Then, the buffer circuit outputs the amplified drive signal in which the amplitude of the drive signal increases, and drives the physical quantity transducer. Thus, when the driving circuit and the detection circuit are operated by the regulated power-supply voltage subjected to the voltage adjustment by the regulator circuit, it is possible to inhibit a detection performance from being degraded by the power-supply voltage variation, and it is possible to improve the detection performance of the detection device, and the like. On the other hand, the buffer circuit is operated not by the regulated power-supply voltage but by the power-supply voltage, and thus it is possible to output the amplified drive signal in which the amplitude of the drive signal from the driving circuit increases to the physical quantity transducer. Therefore, it is possible to realize shortening of a start-up time, improvement of the detection performance, and the like together.

In the detection device according to the aspect of the invention, the amplified drive signal from the buffer circuit may be output to the physical quantity transducer in a first mode, and the drive signal from the driving circuit may be output to the physical quantity transducer in a second mode.

With this configuration, when driving by the amplified drive signal is required, the detection device is able to be set to the first mode, and when driving by a usual drive signal is preferable, the detection device is able to be set to the second mode, and thus it is possible to improve convenience.

In the detection device according to the aspect of the invention, the physical quantity transducer may be a vibrator, and the detection device may be set to the first mode in a start-up period of oscillation of the vibrator, and the amplified drive signal from the buffer circuit may be output to the vibrator.

With this configuration, in the start-up period of the oscillation of the vibrator which is the physical quantity transducer, the driving by the amplified drive signal is performed, and thus it is possible to shorten the start-up time of the oscillation.

In the detection device according to the aspect of the invention, the detection device may be set to the second mode after the start-up period is completed, and the drive signal from the driving circuit may be output to the vibrator.

With this configuration, in a normal state of the oscillation after the start-up period is completed, the vibrator is driven not by the amplified drive signal but by the low amplitude drive signal from the driving circuit, and thus it is possible to improve the detection performance of the desired signal, and the like.

In the detection device according to the aspect of the invention, the buffer circuit may include an operational amplifier in which the drive signal from the driving circuit is input into a non-inversion input terminal, and a first resistive element and a second resistive element which are disposed between an output node of the operational amplifier and a node of a low potential side electric power supply in series, and a connection node between the first resistive element and the second resistive element may be connected to an inversion input terminal of the operational amplifier.

With this configuration, the amplitude of the drive signal from the driving circuit is able to be amplified at an amplification factor which is set by the resistance values of the first and the second resistive element.

In the detection device according to the aspect of the invention, the driving circuit and the detection circuit may be configured by a transistor of a first pressure resistance, and the buffer circuit may be configured by a transistor of a second pressure resistance which is a pressure resistance higher than the first pressure resistance.

Thus, the driving circuit and the detection circuit are configured by the transistor of the first pressure resistance which is the low pressure resistance, and thus it is possible to realize low power consumption, and the like. In contrast, the buffer circuit is configured by the transistor of the second pressure resistance which is the high pressure resistance, and thus it is possible to effectively prevent a problem such as breakdown or wreck of the transistor due to high amplitude driving from occurring.

In the detection device according to the aspect of the invention, the physical quantity transducer may be a vibrator, the driving circuit may include a current-voltage conversion circuit which receives the feedback signal, and performs a current-voltage conversion, a drive signal output circuit which amplifies an input voltage signal after being subjected to the current-voltage conversion by the current-voltage conversion circuit, and outputs the drive signal of a sine wave, and a gain control circuit which controls a gain of amplification of the drive signal in the drive signal output circuit, and when a resistance for a current-voltage conversion of the current-voltage conversion circuit is set to RI, the gain of the amplification of the drive signal by the drive signal output circuit and the buffer circuit is set to K, and an equivalent series resistance in a fundamental wave mode of the vibrator is set to R, the gain control circuit may perform a gain control such that K×RI=R is satisfied.

Thus, the gain control is performed such that K×RI=R is satisfied, and thus it is possible to set a negative resistance on the driving circuit side to a resistance corresponding to the equivalent series resistance of the vibrator. Accordingly, it is possible to drive the vibrator by the drive signal of a sine wave, and it is possible to improve the detection performance of the detection device, and the like.

In the detection device according to the aspect of the invention, the drive signal output circuit may include an Operational Transconductance Amplifier (OTA) circuit in which a transconductance is set by the control voltage from the gain control circuit, and the input voltage signal is converted into a current signal, and a second current-voltage conversion circuit which performs a current-voltage conversion with respect to the current signal from the OTA circuit, and outputs the drive signal.

With this configuration, the input voltage signal is converted into the current signal by the transconductance which is set according to the control voltage, and thus it is possible to create a signal in which the current signal is subjected to the current-voltage conversion as the drive signal.

In the detection device according to the aspect of the invention, the OTA circuit may include a voltage-current conversion circuit which converts the control voltage from the gain control circuit into a control current, and a differential unit in which a bias current set by the control current flows to a bias current source, an analog based voltage is input into a first differential input terminal, an input voltage signal is input into a second differential input terminal, and the current signal is output to the second current-voltage conversion circuit.

With this configuration, the control voltage is converted into the control current, and thus it is possible to allow the bias current corresponding to the control current to flow into the bias current source of the differential unit. Accordingly, it is possible to convert the input voltage signal into the current signal by the transconductance which is set according to the control voltage.

In the detection device according to the aspect of the invention, a second driving circuit which receives a second feedback signal from a second physical quantity transducer, and drives the second physical quantity transducer; a second detection circuit which receives a second detection signal from the second physical quantity transducer, and detects a desired signal; a second regulator circuit which performs a voltage adjustment of stepping down the power-supply voltage from the power-supply terminal, and supplies a second regulated power-supply voltage obtained by the voltage adjustment to the second driving circuit and the second detection circuit; and a second buffer circuit which is supplied with the power-supply voltage, receives a second drive signal from the second driving circuit, and outputs a second amplified drive signal in which an amplitude of the second drive signal increases to the second physical quantity transducer may be further included.

With this configuration, it is possible to drive and detect a plurality of physical quantity transducers. Then, for example, it is possible to effectively inhibit an adverse effect such as a power-supply voltage variation due to the driving and the detection of the physical quantity transducer from reaching the driving and the detection of the second physical quantity transducer, or an adverse effect such as a power-supply voltage variation due to the driving and the detection of the second physical quantity transducer from reaching the driving and the detection of the physical quantity transducer.

In the detection device according to the aspect of the invention, the amplified drive signal from the buffer circuit may be output to the physical quantity transducer, and the second amplified drive signal from the second buffer circuit may be output to the second physical quantity transducer in the first mode, and the drive signal from the driving circuit may be output to the physical quantity transducer, and the second drive signal from the second driving circuit may be output to the second physical quantity transducer in the second mode.

With this configuration, when the driving and the detection are performed with respect to the plurality of physical quantity transducers, the detection device is set to the first mode at the time of requiring the driving by the amplified drive signal, and the detection device is set to the second mode at the time of requiring the driving by the usual drive signal, and thus it is possible to improve convenience.

In the detection device according to the aspect of the invention, the physical quantity transducer may be a vibrator for detecting a rotation angular velocity around a first axis, and the second physical quantity transducer may be a vibrator for detecting a rotation angular velocity around a second axis.

With this configuration, it is possible to effectively reduce interference between axes at the time of detecting the rotation angular velocity of a plurality of rotation axes.

Another aspect of the invention is directed to a sensor including: the detection device according to the aspect of the invention; and the physical quantity transducer.

Still another aspect of the invention is directed to an electronic apparatus comprising the detection device according to the aspect of the invention.

Yet another aspect of the invention is directed to a moving object comprising the detection device according to the aspect of the invention.

BRIEF DESCRIPTION OF THE DRAWINGS

The invention will be described with reference to the accompanying drawings, wherein like numbers reference like elements.

FIGS. 5A and 5B are second configuration examples of the buffer circuit.

DESCRIPTION OF EXEMPLARY EMBODIMENTS

Hereinafter, a preferable embodiment of the invention will be described in detail. Furthermore, this embodiment described hereinafter does not unrightfully limit the contents disclosed in claims, and entire configurations described in this embodiment are not essential as a solution of the invention. For example, hereinafter, a case where a physical quantity transducer is a piezoelectric vibrator (a vibrational gyroscope), and a sensor is a gyroscope sensor is described as an example, but the invention is not limited thereto. For example, the invention is able to be applied to an electrostatic capacitance detection type vibrator (a vibrational gyroscope) formed of a silicon substrate or the like, a physical quantity transducer which detects a physical quantity equivalent to angular velocity information, and a physical quantity other than angular velocity information, a sensor, and the like.

1. Electronic Apparatus and Gyroscope Sensor

Figure 1:
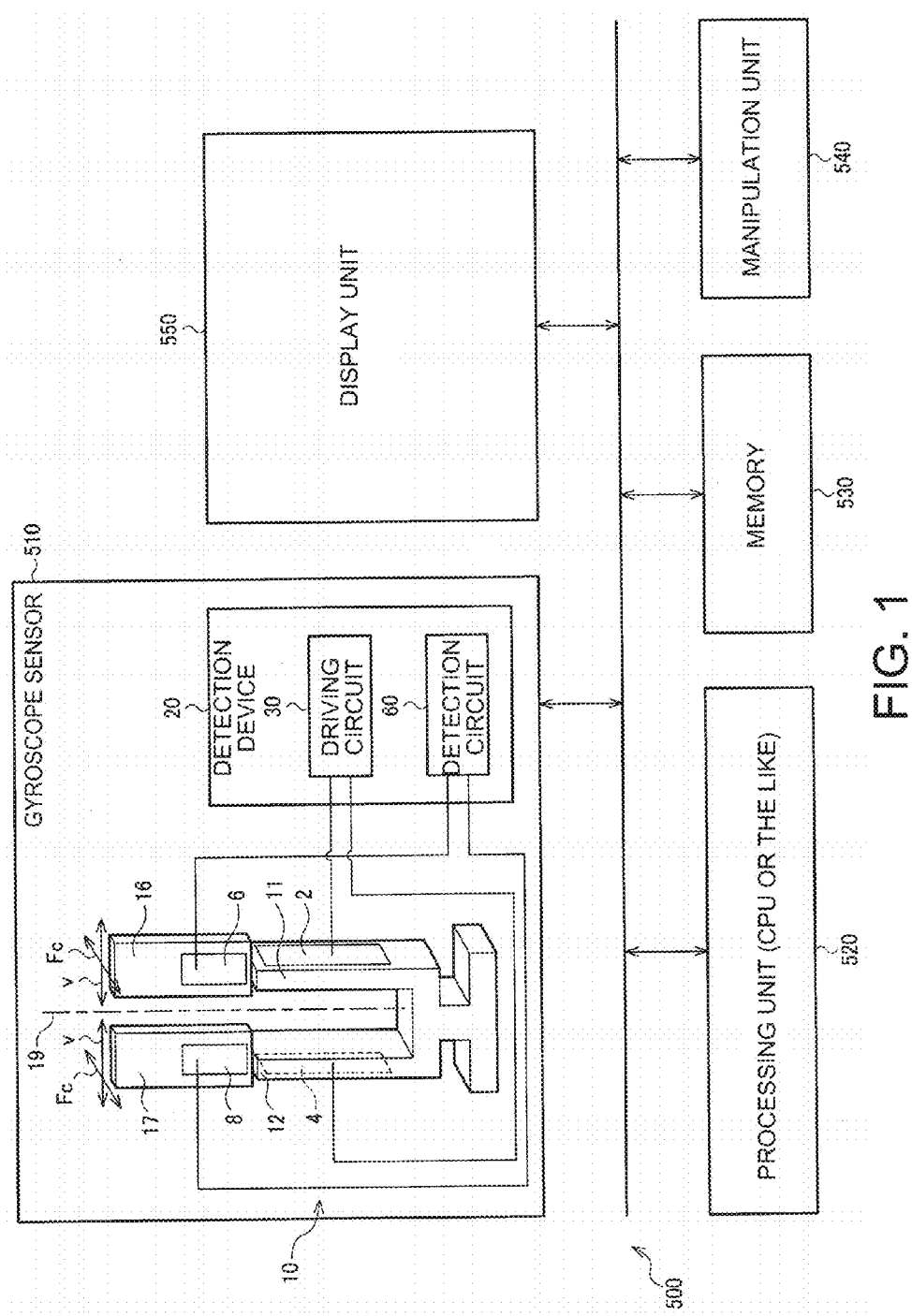
FIG. 1 is a configuration example of an electronic apparatus and a gyroscope sensor according to this embodiment.

FIG. 1 illustrates a configuration example of a gyroscope sensor 510 (in a broad sense, a sensor) including a detection device 20 according to this embodiment, and an electronic apparatus 500 including the gyroscope sensor 510. Furthermore, the electronic apparatus 500 and the gyroscope sensor 510 are not limited to the configuration illustrated in FIG. 1, and are able to be variously changed by omitting apart of constituents thereof or by adding other constituents. In addition, as the electronic apparatus 500 of this embodiment, various equipment such as a digital camera, a camcorder, a smart phone, a mobile phone, a car navigation system, a robot, a game console, a chronometer, health appliances, or a portable information terminal are able to be assumed.

The electronic apparatus 500 includes the gyroscope sensor 510 and a processing unit 520. In addition, the electronic apparatus 500 may include a memory 530, a manipulation unit 540, and a display unit 550. The processing unit 520 (a CPU, an MPU, and the like) controls the gyroscope sensor 510 or the like, or controls the entire electronic apparatus 500. In addition, the processing unit 520 performs a process on the basis of angular velocity information (in a broad sense, a physical quantity) detected by the gyroscope sensor 510. For example, a process of a camera shake correction, a posture control, a GPS autonomous navigation, and the like is performed on the basis of the angular velocity information. The memory 530 (a ROM, a RAM, and the like) stores a control program or various data items, or functions as a work region or a data storage region. The manipulation unit 540 allows a user to manipulate the electronic apparatus 500, and the display unit 550 displays various information items to the user.

The gyroscope sensor 510 (a sensor) includes a vibrator 10, and a detection device 20. The vibrator 10 (in a broad sense, a physical quantity transducer) of FIG. 1 is a tuning fork type piezoelectric vibrator which is formed of a thin plate of a piezoelectric material such as a crystal, and includes vibrators 11 and 12 for driving, and vibrators 16 and 17 for detection. The vibrators 11 and 12 for driving are provided with drive terminals 2 and 4, and the vibrators 16 and 17 for detection are provided with detection terminals 6 and 8.

A driving circuit 30 included in the detection device 20 outputs a drive signal (a drive voltage) and drives the vibrator 10. Then, the driving circuit 30 receives a feedback signal from the vibrator 10, and thus excites the vibrator 10. A detection circuit 60 receives a detection signal (a detection current, and an electric charge) from the vibrator 10 which is driven by the drive signal, and detects (extracts) a desired signal (a Coriolis force signal) corresponding to a physical quantity applied to the vibrator 10 from the detection signal.

Specifically, the drive signal (the drive voltage) of an alternate current from the driving circuit 30 is applied to a drive terminal 2 of the vibrator 11 for driving. Then, the vibrator 11 for driving starts vibration by a reverse voltage effect, and the vibrator 12 for driving starts vibration by tuning fork type vibration. At this time, a current (an electric charge) generated by a piezoelectric effect of the vibrator 12 for driving is fed back to the driving circuit 30 from a drive terminal 4 as a feedback signal. Accordingly, an oscillation loop including the vibrator 10 is formed.

When the vibrators 11 and 12 for driving are vibrated, the vibrators 16 and 17 for detection are vibrated at a vibration velocity v in a direction illustrated in FIG. 1. Then, a current (an electric charge) generated by a piezoelectric effect of the vibrators 16 and 17 for detection is output from detection terminals 6 and 8 as a detection signal (a first detection signal and a second detection signal). Then, the detection circuit 60 receives the detection signal from the vibrator 10, and detects a desired signal (a desired wave) which is a signal corresponding to the Coriolis force. That is, when the vibrator 10 (a gyroscope sensor) is rotated around a detection axis 19 as a center, Coriolis force Fc is generated in a direction perpendicular to a vibration direction of the vibration velocity v. For example, an angular velocity at the time of being rotated around the detection axis 19 as a center is set to ω, a mass of the vibrator is set to m, and a vibration velocity of the vibrator is set to v, and the Coriolis force is shown by Fc=2m·v·ω. Accordingly, the detection circuit 60 detects the desired signal which is a signal corresponding to the Coriolis force, and thus it is possible to obtain the rotation angular velocity ω of the gyroscope sensor. Then, by using the obtained angular velocity ω, the processing unit 520 is able to perform various processes of a camera shake correction, a posture control, a GPS autonomous navigation, and the like.

Furthermore, in FIG. 1, a case where the vibrator 10 is a tuning fork type vibrator is illustrated as an example, but the vibrator 10 of this embodiment is not limited to such a configuration. For example, the vibrator may be a T-shaped vibrator, a double T-shaped vibrator, and the like. In addition, the piezoelectric material of the vibrator 10 may be other materials in addition to the crystal.

2. Detection Device

Figure 2:
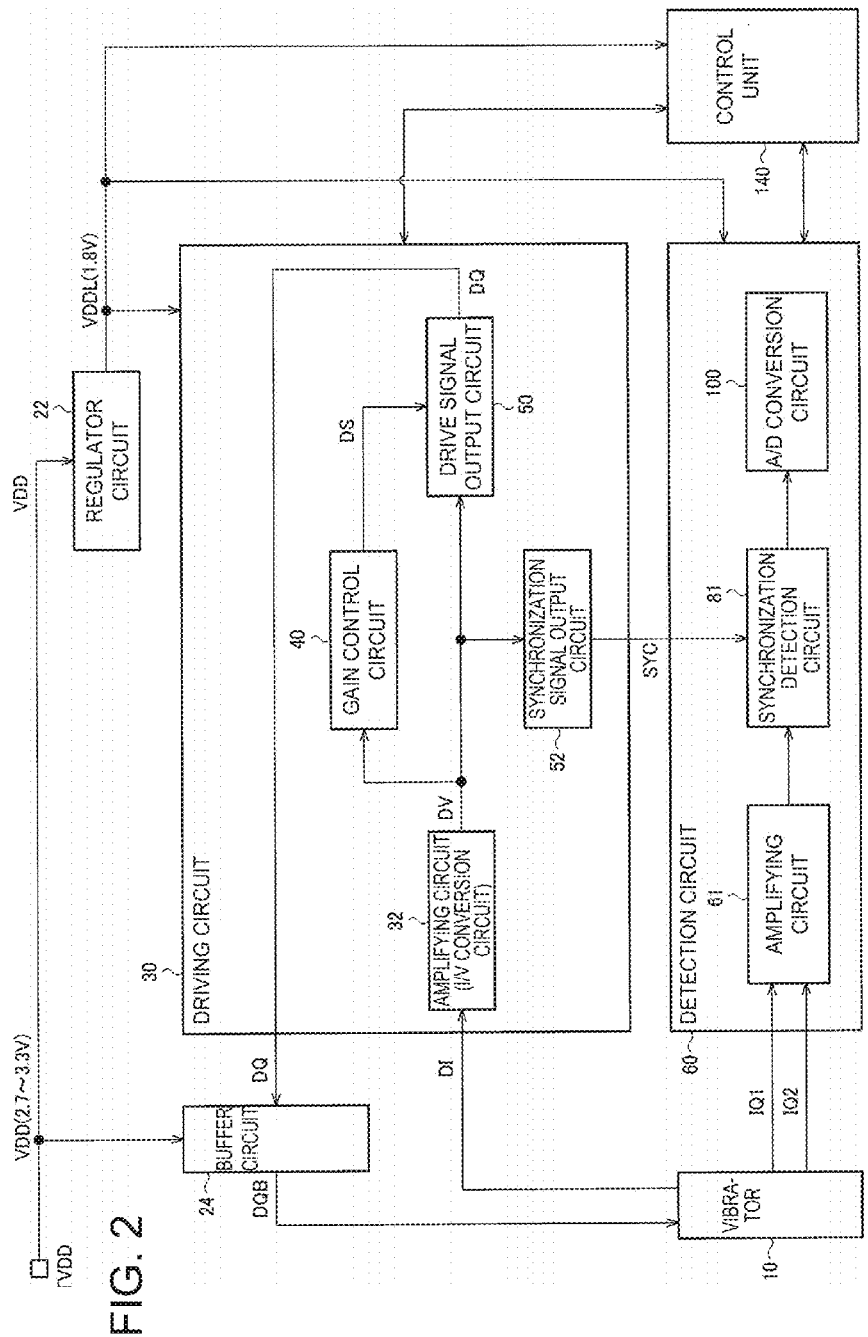
FIG. 2 is a configuration example of a detection device according to this embodiment.

FIG. 2 illustrates a configuration example of the detection device 20 according to this embodiment. The detection device 20 includes the driving circuit 30 which receive a feedback signal DI from the vibrator 10 (the physical quantity transducer), and drives the vibrator 10, and the detection circuit 60 which receives detection signals IQ1 and IQ2 from the vibrator 10, and detects the desired signal.

In addition, the detection device 20 (an integrated circuit device) includes a power-supply terminal TVDD into which a power-supply voltage VDD is input, a regulator circuit 22, and a buffer circuit 24.

For example, the power-supply voltage VDD is input into the power-supply terminal TVDD from the outside. The power-supply voltage VDD is supplied to the regulator circuit 22 or the buffer circuit 24. The power-supply terminal TVDD, for example, is a pad of the integrated circuit device (an IC chip).

The regulator circuit 22 performs a voltage adjustment of stepping down the power-supply voltage VDD supplied from the power-supply terminal TVDD. Then, a regulated power-supply voltage VDDL obtained by the voltage adjustment is supplied to the driving circuit 30 and the detection circuit 60 as an operating power-supply voltage. In addition, the regulator circuit 22 supplies the regulated power-supply voltage VDDL to a control unit 140. For example, when a voltage of 2.7 V to 3.3 V is supplied from the outside as the power-supply voltage VDD, the regulator circuit 22 performs the voltage adjustment of stepping down the power-supply voltage VDD, and for example, a constant voltage of 1.8 V of the power-supply voltage VDDL is supplied to the driving circuit 30, the detection circuit 60, and the control unit 140.

The power-supply voltage VDD is supplied to the buffer circuit 24. The power-supply voltage VDD is used as a high potential side power-supply voltage of the buffer circuit 24. Then, the buffer circuit 24 receives the drive signal DQ from the driving circuit 30, and outputs a drive signal (an amplified drive signal) DQB of a high amplitude in which an amplitude of the drive signal DQ increases to the vibrator 10 (the physical quantity transducer). For example, when the amplitude of the drive signal DQ is set to a first amplitude, a drive signal DQB of a second amplitude which is greater than the first amplitude is output to the vibrator 10. In this case, the drive signals DQ and DQB may be a rectangular wave signal, and may be a sine wave signal.

The driving circuit 30 includes an amplifying circuit 32 into which the feedback signal DI from the vibrator 10 is input, a gain control circuit 40 which performs an automatic gain control, and a drive signal output circuit 50 which outputs the drive signal DQ to the vibrator 10. In addition, the driving circuit 30 includes a synchronization signal output circuit 52 which outputs a synchronization signal SYC to the detection circuit 60. Furthermore, a configuration of the driving circuit 30 is not limited to the configuration illustrated in FIG. 2, and is able to be variously changed by omitting a part of constituents thereof or by adding other constituents.

The amplifying circuit 32 (an I/V conversion circuit) amplifies the feedback signal DI from the vibrator 10. For example, the amplifying circuit 32 converts a current signal DI from the vibrator 10 into a voltage signal DV, and outputs the signal. The amplifying circuit 32 is able to be realized by a capacitor, a resistive element, an operational amplifier, and the like.

The drive signal output circuit 50 outputs the drive signal DQ on the basis of the signal DV after being subjected to amplification by the amplifying circuit 32. For example, when the drive signal output circuit 50 outputs the drive signal of a rectangular wave (or a sine wave), the drive signal output circuit 50 is able to be realized by a comparator or the like.

The gain control circuit 40 (AGC) outputs the control voltage DS to the drive signal output circuit 50, and controls the amplitude of the drive signal DQ. Specifically, the gain control circuit 40 monitors the signal DV, and controls a gain of an oscillation loop. For example, in order to constantly maintain sensitivity of the gyroscope sensor, it is necessary that the driving circuit 30 constantly maintain an amplitude of the drive voltage to be supplied to the vibrator 10 (the vibrator for driving). For this reason, in the oscillation loop of a drive vibration-system, the gain control circuit 40 for automatically adjusting a gain is disposed. The gain control circuit 40 variably and automatically adjusts the gain such that an amplitude (the vibration velocity v of the vibrator) of the feedback signal DI from the vibrator 10 is constant.

The synchronization signal output circuit 52 receives the signal DV after being subjected to the amplification by the amplifying circuit 32, and outputs the synchronization signal SYC (a reference signal) to the detection circuit 60. The synchronization signal output circuit 52 is able to be realized by a comparator which creates a synchronization signal SYC of a rectangular wave by performing a binarization process with respect to a sine wave (an alternate current) signal DV, a phase adjustment circuit (a phase shifter) which performs a phase adjustment with respect to the synchronization signal SYC, and the like.

The detection circuit 60 includes an amplifying circuit 61, a synchronization detection circuit 81, and an A/D conversion circuit 100. The amplifying circuit 61 receives a first detection signal IQ1 and a second detection signal IQ2 from the vibrator 10, and performs signal amplification or an electric charge-voltage conversion. The synchronization detection circuit 81 performs a synchronous detection on the basis of the synchronization signal SYC of the driving circuit 30. The A/D conversion circuit 100 performs an A/D conversion with respect to the signal after being subjected to the synchronous detection. Furthermore, as a configuration of the detection circuit 60, various types of configurations described later are able to be adopted. The details will be described later.

The detection device 20 may further include the control unit 140. The control unit 140 performs a control process with respect to the detection device 20. The control unit 140 is able to be realized by a logic circuit (a gate array or the like), a processor, and the like. Various switching controls, mode settings, and the like with respect to the detection device 20 are performed by the control unit 140.

3. High Amplitude Driving Using Buffer Circuit

In this embodiment, as illustrated in FIG. 2, the voltage adjustment of stepping down the power-supply voltage VDD from the outside is performed by the regulator circuit 22, and the regulated power-supply voltage VDDL which is subjected to the voltage adjustment is supplied to the driving circuit 30 or the detection circuit 60. Then, the driving circuit 30 or the detection circuit 60 is operated by the regulated power-supply voltage VDDL as the operating power-supply voltage.

Thus, the regulated power-supply voltage VDDL which is adjusted to be a constant voltage is created, and when the driving circuit 30 and the detection circuit 60 are operated by the regulated power-supply voltage VDDL, it is possible to improve a detection performance, and the like.

That is, as in the related art, in a configuration where the driving circuit 30 and the detection circuit 60 are operated by the power-supply voltage VDD from the outside, when there is a voltage variation in the power-supply voltage VDD, for example, a zero point variation of a gyroscope or the like may occur due to the voltage variation.

In this respect, in this embodiment, the driving circuit 30 and the detection circuit 60 are not operated by the power-supply voltage VDD as the operating power-supply voltage, but the driving circuit 30 and the detection circuit 60 are operated by the regulated power-supply voltage VDDL which is created by the regulator circuit 22 as the operating power-supply voltage. According to this, even when there is a voltage variation in the power-supply voltage VDD, the voltage variation is absorbed by the regulator circuit 22, and thus it is possible to inhibit the voltage variation of the VDD from being transferred to the driving circuit 30 and the detection circuit 60.

That is, even when, for example, the power-supply voltage VDD is varied in a range of 2.7 V to 3.3 V, it is possible to suppress the voltage variation of the regulated power-supply voltage VDDL, for example, to be less than or equal to 1 mV (for example, less than or equal to 0.3 mV) by using the regulator circuit 22 of this embodiment. In addition, even when there is a temperature variation, it is possible to suppress a variation of the regulated power-supply voltage VDDL, for example, to be less than or equal to ±several dozen mV (for example, less than or equal to ±30 mV). Accordingly, even when there is a variation of the power-supply voltage VDD, the variation of the regulated voltage VDDL is suppressed to a minimum, and thus a zero point (an output of the gyroscope in a static state) is varied due to the variation of the power-supply voltage VDD. Therefore, it is possible to inhibit the detection performance from being degraded.

Figure 3A:
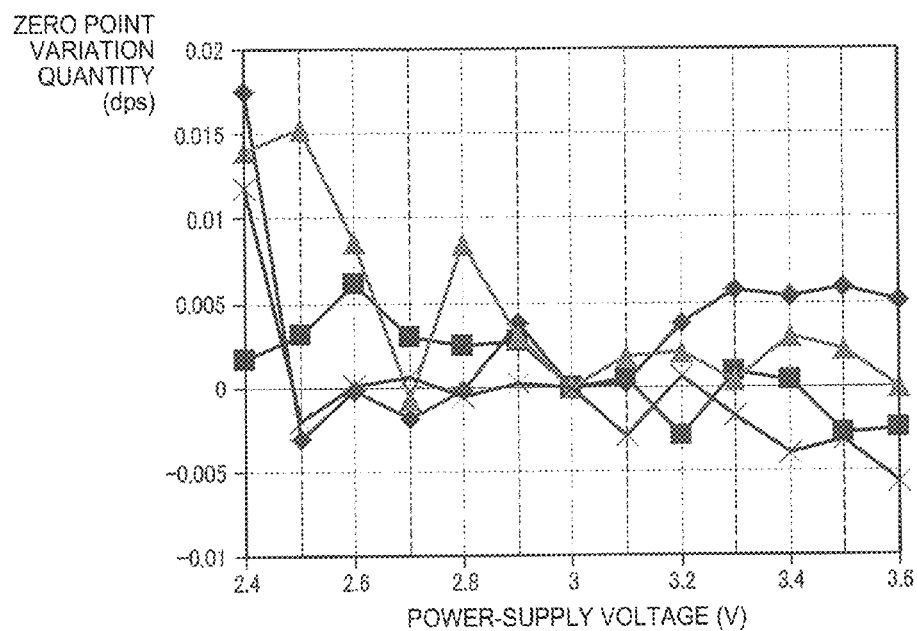
FIG. 3A is a diagram illustrating a relationship between a power-supply voltage VDD and a zero point variation quantity.

For example, FIG. 3A is a diagram illustrating a relationship between the power-supply voltage VDD and a zero point variation quantity (the number of samples is 4) when the regulator circuit 22 is used as in this embodiment. As illustrated in FIG. 3A, in this embodiment, for example, even when the power-supply voltage VDD is varied in a range of 2.7 V to 3.3 V, it is possible to suppress the zero point variation quantity (Degree per second: dps) to a minimum (for example, less than or equal to 0.01 dps).

In addition, according to this embodiment, the driving circuit 30, the detection circuit 60, and the control unit 140 which occupy a great part of a circuit of the detection device are able to be operated by a low regulated power-supply voltage VDDL. Accordingly, a great part of the circuit is operated by the low power-supply voltage, and thus it is possible to effectively reduce power consumption.

Figure 3B:
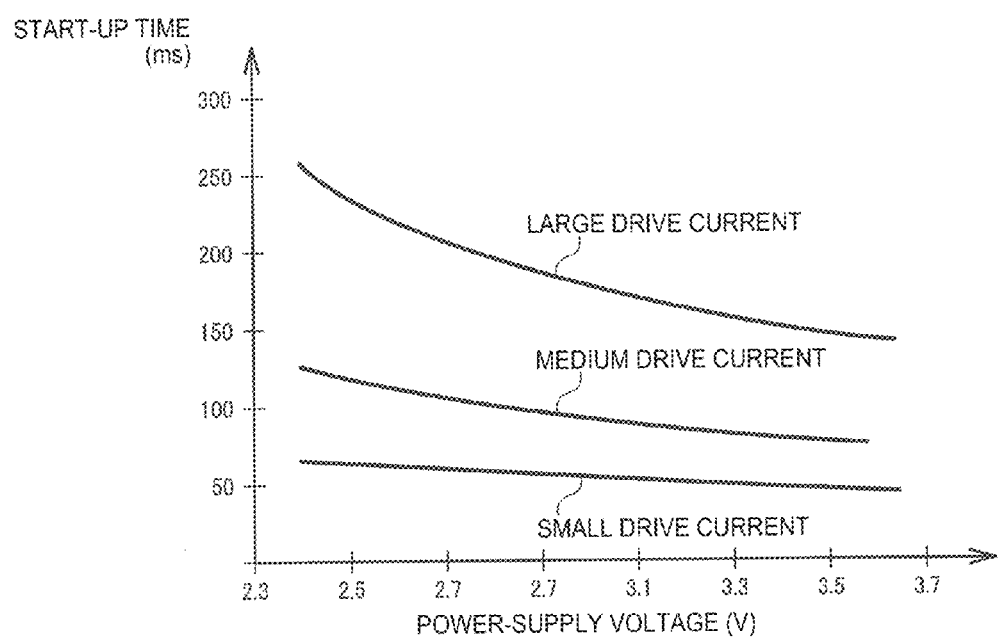
FIG. 3B is a diagram illustrating a relationship between a power-supply voltage and a start-up time.

However, when the driving circuit 30 or the like is operated by the regulated power-supply voltage VDDL of a low voltage, a start-up time of the oscillation becomes long. For example, FIG. 3B is a diagram illustrating a relationship between the power-supply voltage and the start-up time. As illustrated in FIG. 3B, the start-up time becomes longer as the power-supply voltage decreases. For example, as illustrated in FIG. 3B, the start-up time becomes longer as the drive current of the vibrator 10 increases. Then, when the drive current increases, and when the power-supply voltage is, for example, less than or equal to approximately 2.7 V, the start-up time becomes long in an exponential manner, and thus may exceed an allowable range. That is, when the regulated power-supply voltage VDDL (for example, 1.8 V) is used as the power-supply voltage of the driving circuit 30 or the like, the start-up time extremely becomes long, and thus may be an unusable level.

Therefore, in this embodiment, as illustrated in FIG. 2, the regulated power-supply voltage VDDL created by the regulator circuit 22 is supplied to the driving circuit 30 and the detection circuit 60, and thus improvement of the detection performance or low power consumption is realized. On the other hand, not the regulated power-supply voltage VDDL but the power-supply voltage VDD is supplied to the buffer circuit 24 which buffers the drive signal DQ. That is, in the related art, the power-supply voltage VDD is supplied to the entire circuit of the detection device, but in this embodiment, the circuit (the integrated circuit device) of the detection device is divided into a first circuit portion to which the regulated power-supply voltage VDDL is supplied, and a second circuit portion to which the power-supply voltage VDD is supplied. Then, the driving circuit 30, the detection circuit 60, and the control unit 140 which are required to realize improvement of the detection performance or low power consumption are set to the first circuit portion to which the regulated power-supply voltage VDDL is supplied, and the buffer circuit is set to the second circuit portion to which the power-supply voltage VDD is directly supplied.

Then, the buffer circuit 24 performs a conversion for increasing the amplitude of the drive signal DQ from the driving circuit 30 by using the supplied power-supply voltage VDD, and the drive signal (the amplified drive signal) DQB of a high amplitude is output to the vibrator 10. That is, the drive signal DQB having a peak-to-peak voltage which is higher than a peak-to-peak voltage of the drive signal DQ is created, and the vibrator 10 is driven by the drive signal DQB.

According to this, as it is clear from FIG. 3B, it is possible to shorten the start-up time compared to a case where the vibrator 10 is driven by the drive signal DQ using the regulated power-supply voltage VDDL. That is, in this embodiment, it is possible to realize improvement of the detection performance or low power consumption, and shortening of the start-up time together.

4. Configuration Example of Buffer Circuit

Figure 4:
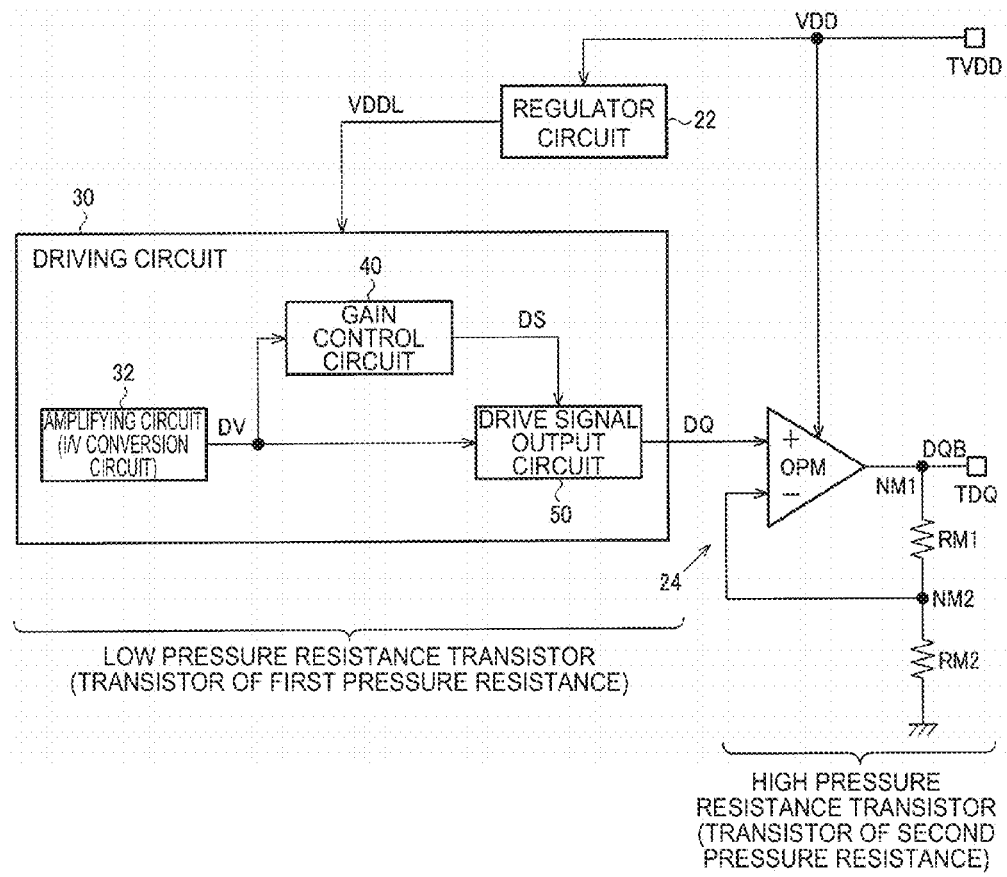
FIG. 4 is a first configuration example of a buffer circuit.

Next, a specific configuration example of the buffer circuit 24 will be described. FIG. 4 illustrates a first configuration example of the buffer circuit 24.

In FIG. 4, the buffer circuit 24 includes an operational amplifier OPM, and a first resistive element RM1 and a second resistive element RM2. In the operational amplifier OPM, the drive signal DQ from the driving circuit 30 is input to a non-inversion input terminal. The operational amplifier OPM is operated by the power-supply voltage VDD from the power-supply terminal TVDD as the operating power-supply voltage. The first resistive element RM1 and the second resistive element RM2 are disposed between an output node NM1 of the drive signal DQB of a high amplitude and a node of the low potential side electric power supply (GND) in series. Then, a connection node NM2 between the first resistive element RM1 and the second resistive element RM2 is connected to an inversion input terminal of the operational amplifier OPM. Furthermore, the regulator circuit 22 is also realized by the same configuration as the buffer circuit 24 of FIG. 4.

In FIG. 4, resistances of the resistive elements RM1 and RM2 are set to R1 and R2, and the amplitudes of the drive signals DQ and DQB are set to AP and APB. Then, a relational expression of APB={ (R1+R2)/R2}×AP is satisfied. For example, when R1=200 KΩ, and R2=400 KΩ, APB={(200 KΩ+400 KΩ)/400 KΩ}×AP=1.5×AP, and the drive signal DQB is a signal in which the amplitude (the peak-to-peak voltage) of the drive signal DQ increases 1.5-fold. Accordingly, high amplitude driving of the vibrator 10 is possible, and thus it is possible to realize shortening of the start-up time of the oscillation.

In addition, in this embodiment, the driving circuit 30 and the detection circuit 60 are configured by a low pressure resistance transistor (a transistor of a first pressure resistance), and the buffer circuit 24 is configured by a high pressure resistance transistor (a transistor of a second pressure resistance which is a pressure resistance higher than the first pressure resistance). For example, the low pressure resistance transistor is a transistor of which the pressure resistance is higher than 1.8 V and lower than the high pressure resistance transistor, and the high pressure resistance transistor is a transistor of which the pressure resistance is higher than 3.3 V. The high pressure resistance transistor, for example, is able to be realized by making a thickness of a gate oxide film thicker than the low pressure resistance transistor, or by making a gate length longer. The driving circuit 30, the detection circuit 60, and the control unit 140 which occupy a great part of the detection device are configured by the low pressure resistance transistor, and thus low power consumption of the detection device, downsizing of a circuit layout, and the like are realized. The buffer circuit 24 is configured by the high pressure resistance transistor, and thus it is possible to effectively prevent breakdown, wreck, and the like of the transistor due to the high amplitude driving from occurring.

FIGS. 5A and 5B illustrate a second configuration example of the buffer circuit 24. The detection device including the buffer circuit 24 of the second configuration example outputs the drive signal DQB of a high amplitude from the buffer circuit 24 to the vibrator 10 (the physical quantity transducer) in a first mode of FIG. 5A. On the other hand, the detection device including the buffer circuit 24 of the second configuration example outputs the drive signal DQ from the driving circuit 30 to the vibrator 10 in a second mode of FIG. 5B.

Specifically, in the second configuration example, a switch element SWM is disposed between the output node NM1 and an input node of the buffer circuit 24. Then, as illustrated in FIG. 5A, the switch element SWM is turned OFF in the first mode. Accordingly, the drive signal DQ of a high amplitude from the buffer circuit 24 is output to the vibrator 10. Furthermore, in this case, for example, the operational amplifier OPM is set to an operation enabled state by the enable signal ENB.

In contrast, the switch element SWM is turned ON in the second mode. Accordingly, the drive signal DQ of a low amplitude from the driving circuit 30 is output to the vibrator 10 through the switch element SWM. Furthermore, in this case, for example, the operational amplifier OPM is set to an operation disabled state by the enable signal ENB. For example, an output of the operational amplifier OPM is set to a high impedance state.

In addition, in the second configuration example, switch elements SWM1 and SWM2 are disposed in response to the resistive elements RM1 and RM2. Then, in the first mode of FIG. 5A, the switch elements SWM1 and SWM2 are turned ON, and in the second mode of FIG. 5B, the switch elements SWM1 and SWM2 are turned OFF. Accordingly, in the second mode, it is possible to prevent a current which is not necessary for VSS (GND) from flowing from the output node NM1 of the buffer circuit 24, or a voltage which is not necessary for the inversion input terminal of the operational amplifier OPM from being applied.

Figure 6:
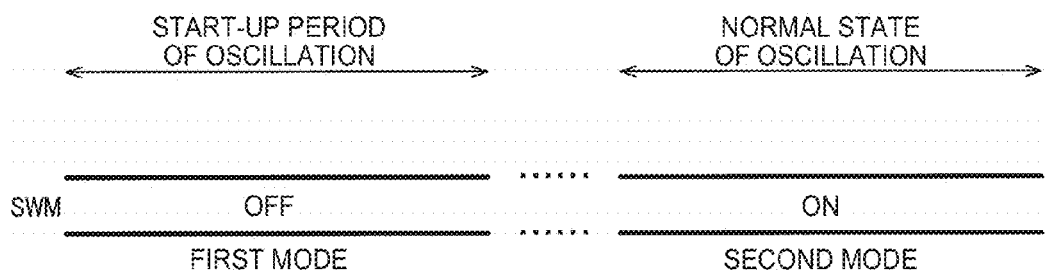
FIG. 6 is an explanatory view of a first mode and a second mode.

For example, as illustrated in FIG. 6, in the start-up period of the oscillation of the vibrator 10, the detection device is set to the first mode. Accordingly, the drive signal DQB of a high amplitude of the buffer circuit 24 is output to the vibrator 10. On the other hand, after the start-up period is completed, the detection device is set to the second mode. For example, the detection device is set to the second mode in a normal state of the oscillation. Accordingly, the drive signal DQ of a low amplitude from the driving circuit 30 is output to the vibrator 10.

For example, in the start-up period, in order to shorten the start-up time of the oscillation of the vibrator 10, it is preferable that the high amplitude driving be performed. Accordingly, in the start-up period, as illustrated in FIG. 5A, the switch element SWM is turned OFF, and the vibrator 10 is driven by the drive signal DQB of a high amplitude from the buffer circuit 24, and thus it is possible to shorten the start-up time.

In contrast, when the start-up period is completed, and the vibrator 10 is set to the normal state of the oscillation, there is no request for shortening the start-up time, and thus as illustrated in FIG. 5B, the switch element SWM is turned ON (the switch elements SWM1 and SWM2 are turned OFF), and the vibrator 10 is driven by the drive signal DQ of a low amplitude from the driving circuit 30. Thus, the vibrator 10 is driven by the drive signal DQ of a low amplitude, and thus it is possible to realize low power consumption, noise reduction, and the like. However, according to an application, after the start-up period is completed, and the vibrator 10 is set to the normal state of the oscillation, for example, driving by the drive signal DQB using the power-supply voltage VDD of 2.7 V to 3.3 V may be preferable. Accordingly, in such a case, even after the start-up period is completed, the detection device is set to the first mode.

Furthermore, the setting of the first mode and the second modes, for example, is able to be realized by the control process of the control unit 140. For example, the setting is able to be realized by controlling ON and OFF of the switch elements SWM, SWM1, and SWM2 by the control unit 140. In addition, by a resistor setting of a resistor portion disposed in the detection device, it is possible to set the first mode and the second mode of FIGS. 5A and 5B. For example, it is possible to perform the setting of the first mode and the second mode by accessing the resistor portion through an outside interface.

5. Drive Signal of Sine Wave

In this embodiment, the vibrator may be driven by the drive signal of a rectangular wave, and may be driven by the drive signal of a sine wave. Hereinafter, a driving method by the drive signal of a sine wave will be described in detail.

Figure 7:
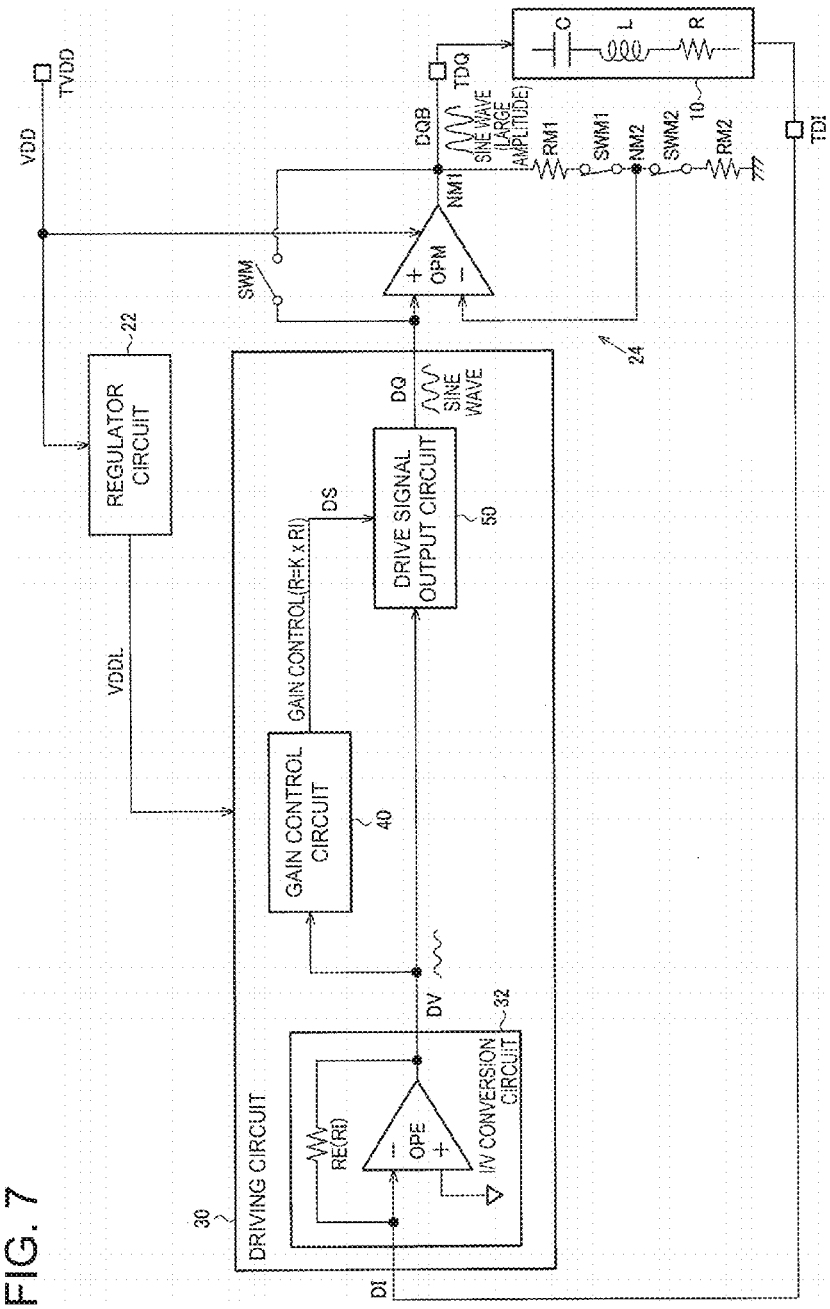
FIG. 7 is a configuration example of a driving circuit which allows a vibrator to oscillate by sine wave driving.

For example, in FIG. 7, the gain control circuit 40 controls the gain of the amplification of the drive signal DQ in the drive signal output circuit 50. Then, an I/V conversion circuit 32 includes a resistive element RE for an I/V conversion. Furthermore, hereinafter, the amplifying circuit 32 of FIG. 2 is described as an I/V conversion circuit 32. For example, the I/V conversion circuit 32 includes an operational amplifier OPE, and a feedback resistive element RE disposed between an output node of the operational amplifier OPE and a node of the inversion input terminal.

Here, a resistance for an I/V conversion (for a current-voltage conversion) which is a resistance value of the resistive element RE is set to RI. In addition, the gain of the amplification of the drive signal DQB in the drive signal output circuit 50 and the buffer circuit 24 is set to K. In addition, the equivalent series resistance (an equivalent series resistance value) of the vibrator 10 in a fundamental wave mode is set to R. For example, the vibrator 10 is shown by equivalent circuits of C, L, and R as illustrated in FIG. 7, and the equivalent series resistance (a resonant resistance) thereof is set to R.

In this case, the gain control circuit 40 performs a gain control to satisfy K×RI=R. For example, the gain control is performed by an AGC loop such that the gain shown by a relational expression of K×RI=R is a target gain. Then, the drive signal output circuit 50 and the buffer circuit 24 amplify the voltage signal DV after being subjected to the I/V conversion by the I/V conversion circuit 32 with the gain in which the relational expression of K×RI=R is satisfied, and output the drive signal DQB to the vibrator 10. Thus, as the drive signal DQB, it is possible to drive the vibrator 10 by outputting not the rectangular wave signal but the sine wave signal to the vibrator 10.

However, in order to oscillate the vibrator, it is necessary that a negative resistance which is sufficient for cancelling a resistance component (and a parasitic resistance such as a contact resistance, or a wiring resistance due to a connection between the vibrator and the circuit) included in the vibrator be realized by an active circuit. That is, a design concept for setting a circuit configuration realizing the negative resistance or a value of the negative resistance is important.

Figure 8A:
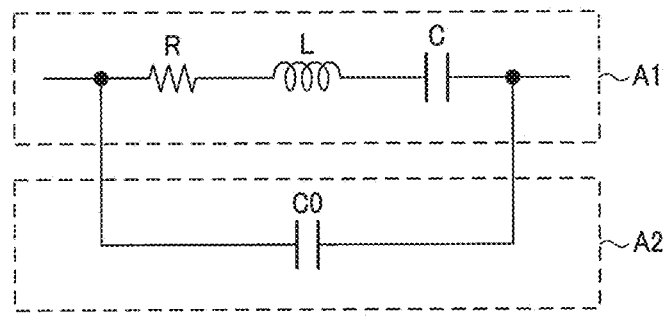
FIGS. 8A to 8C are explanatory views of a negative resistance of the driving circuit of the vibrator.

For example, an electrical equivalent circuit of the vibrator (a crystal vibrator) is shown as illustrated in FIG. 8A. An equivalent series resistance R, an equivalent series inductance L, and an equivalent series capacitance C illustrated by A1 are a portion corresponding to a mechanical resonant circuit. An electrical element of a capacitance C0 illustrated by A2 is an element on an active circuit side, and considers the negative resistance.

Figure 8B:
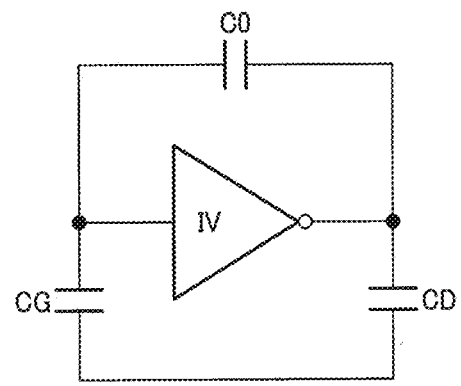

For example, as in FIG. 8B, in a circuit of a usual oscillator using an inverter circuit IV, it is not necessary for a large current to flow, and it is sufficient that the vibrator be oscillated. In the circuit, a negative resistance RN is able to be shown as the following Expression (1).

$$RN = -(CG \times CD)/(Gm \times C0) \quad (1)$$

Here, CG and CD are parasitic capacitances of a gate and a drain of the inverter circuit IV, and Gm is a trans conductance.

Figure 8C:
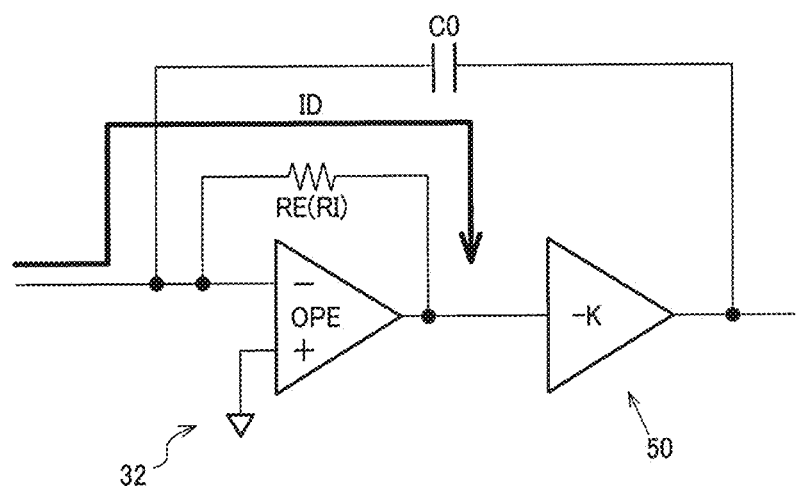

On the other hand, as illustrated in FIG. 8C, in the circuit of the gyroscope sensor, in order to increase detection sensitivity, it is necessary that the vibrator be largely vibrated, and thus it is necessary for a large drive current ID to flow. In the circuit, the negative resistance RN is able to be shown as the following Expression (2).

$$RN = -K \times RI \quad (2)$$

Here, K is the gain of the signal amplification of the drive signal DQB, and RI is the resistance for an I/V conversion (for example, the resistance value of the resistive element RE).

Figure 9A:
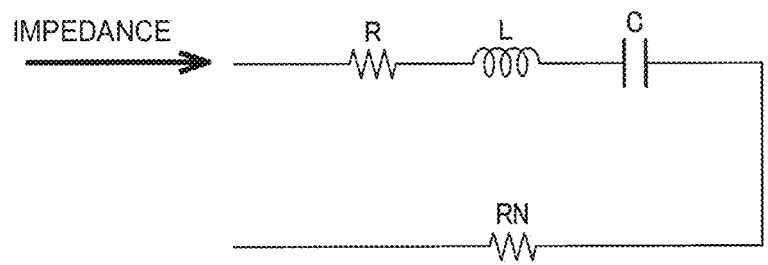
FIGS. 9A and 9B are explanatory views of a method for allowing the vibrator to oscillate by the sine wave driving.

Next, to what value the negative resistance RN is set is considered. In an equivalent circuit of FIG. 9A, a resonant point which is an impedance minimum point is able to be shown by an expression illustrated by C1 in FIG. 9A. Here, C, L, and R are an equivalent series capacitance, an equivalent series inductance, and an equivalent series resistance of the vibrator.

Figure 9B:
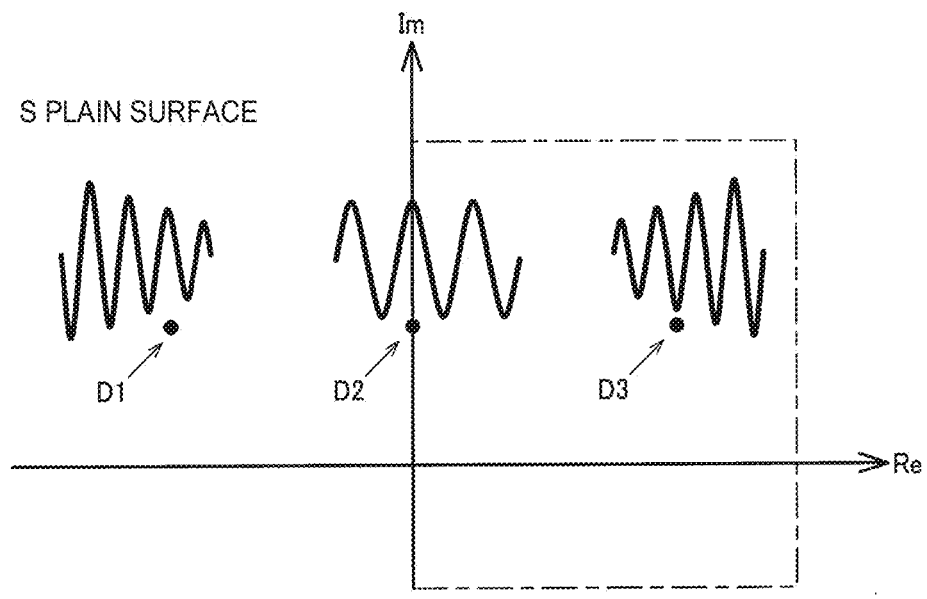

For this reason, when R+RN>0, as illustrated by D1 in FIG. 9B, the resonant point is positioned on a left half surface of an S plain surface. In this case, the amplitude of the oscillation decreases over time. Accordingly, the oscillation is stopped in due course of time.

In contrast, when R+RN=0, as illustrated by D2 in FIG. 9B, the resonant point is positioned on an imaginary axis of the S plain surface, and a frequency is shown by Ws=1/(L× C)$^{1/2}$, and thus the oscillation has a constant amplitude. Then, in this case, the oscillation is continued.

In addition, when R+RN<0, as illustrated by D3 in FIG. 9B, the resonant point is positioned on a right half surface of the S plain surface, and the amplitude of the oscillation increases over time. In this case, the oscillation is also continued.

Figure 10B:
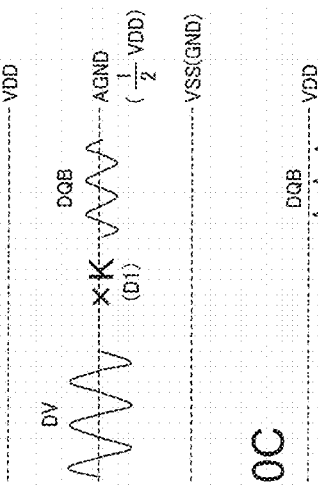
FIG. 10A to FIG. 10D are explanatory views of a method for allowing the vibrator to oscillate by the sine wave driving.
Figure 10C:
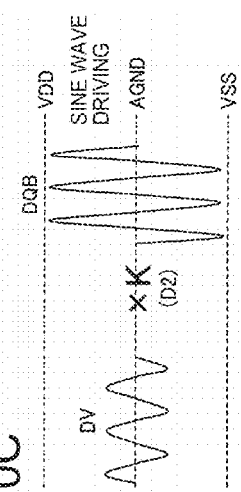
Figure 10D:
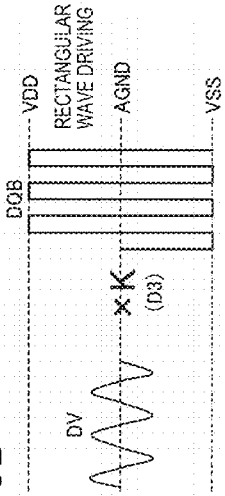
Figure 10A:
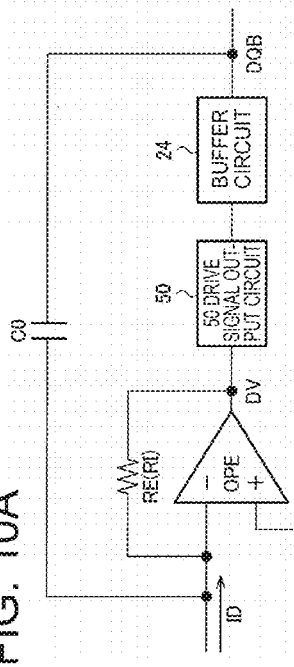

Then, in FIG. 10A, when an input current (the drive current) is set to ID, an output signal DV of the I/V conversion circuit 32 is shown by DV=−RI×ID. Then, the signal DV is amplified by the drive signal output circuit 50 and the buffer circuit 24 which amplify the signal with the gain K, and thus the drive signal is DQB=−K×DV=K×RI× ID.

Here, as illustrated by D1 in FIG. 9B, when R+RN>0, as illustrated in FIG. 10B, the amplitude of the drive signal DQB is less than that of the signal DV, and the oscillation is stopped.

In addition, as illustrated by D2 in FIG. 9B, when R+RN=0, as illustrated in FIG. 10C, the amplitude of the drive signal DQB is greater than that of the signal DV and is turned into the sine wave signal, and thus the oscillation is continued.

In contrast, as illustrated by D3 in FIG. 9B, when R+RN<0, as illustrated in FIG. 10D, the amplitude of the drive signal DQB exceeds a voltage range of the high potential side power-supply voltage VDD to the low potential side power-supply voltage VSS (GND) and is turned into the rectangular wave signal. In this case, the oscillation itself is also continued.

However, as illustrated in FIG. 10D, when the drive signal DQB is turned into the rectangular wave signal, as described later, the rectangular wave signal includes many harmonic components, and thus the detection performance of the detection device is degraded due to the harmonic component.

In contrast, as illustrated in FIG. 10B, when R+RN>0, the amplitude of the drive signal DQB decreases, and thus the oscillation is not continued but is stopped.

Therefore, in this embodiment, as illustrated in FIG. 7, when the resistance for an I/V conversion is set to RI, the gain of the drive signal output circuit 50 and the buffer circuit 24 is set to K, and the equivalent series resistance (including the parasitic resistance) of the vibrator 10 is set to R, the gain control circuit 40 performs the gain control such that the relational expression of K×RI=R is satisfied. That is, the gain control for satisfying the relationship of K×RI=R is performed. Furthermore, satisfying K×RI=R is a target, but it is not necessary that K×RI=R be strictly satisfied.

Here, as shown by Expression (2) described above, in the driving circuit 30 of this embodiment, the negative resistance satisfies the relational expression of RN=−K×RI. Accordingly, the gain control is performed such that K×RI=R is satisfied, and thus R+RN=K×RI+(−K×RI)=0 is satisfied. Accordingly, the vibrator 10 is able to be driven by the sine wave as illustrated in FIG. 10C.

That is, when the gain control which is set to K×RI=R is performed, the relationship of R+RN=0 is satisfied, and thus as illustrated by D2 in FIG. 9B, and the resonant point is positioned on the imaginary axis of the S plain surface.

Then, for example, when the resonant point is moved to the left half surface side of the S plain surface as illustrated by D1 in FIG. 9B, and the amplitude of the drive signal DQB decreases as illustrated in FIG. 10B, the AGC loop of the gain control circuit 40 is moved, and thus the gain control by which the resonant point is returned to the imaginary axis is performed. Accordingly, it is possible to inhibit the oscillation from being stopped by a decrease in the amplitude of the drive signal DQB.

In contrast, when the resonant point is moved to the right half surface side of the S plain surface as illustrated by D3 in FIG. 9B, and the drive signal DQB is turned into a rectangular signal as illustrated in FIG. 10D, the AGC loop of the gain control circuit 40 is moved, and thus the gain control by which the resonant point is returned to the imaginary axis is performed. Accordingly, it is possible to inhibit the detection performance from being degraded by turning the drive signal DQB into the rectangular signal.

For example, in the related art, only in order to make the drive current of the vibrator 10 constant, the gain control by the AGC loop is performed. In this case, when the gain K decreases, as illustrated in FIG. 10B, the amplitude of the drive signal DQB decreases, and the oscillation is stopped, and thus a circuit design is performed by a design method in which the gain K increases as much as possible.

However, in the design method, by setting the gain K to a large value, an absolute value of the negative resistance RN (=−K×RI) also increases, and thus the relationship of R+RN<0 is satisfied. Accordingly, as a result, the vibrator is driven by rectangular wave driving as illustrated in FIG. 10D, and thus the detection performance is degraded due to occurrence of the harmonic component.

In this respect, the inventors of the invention focus on a relationship between a resistance RI for an I/V conversion and the gain K in FIG. 10A. Then, the gain control by the AGC loop satisfying K×RI=R is performed, and thus it is found that the vibrator 10 is able to be driven by the drive signal DQB of a sine wave as illustrated in FIG. 10C.

That is, the gain control circuit 40 including the AGC loop is used as a circuit which not only makes the drive current of the vibrator 10 constant but also satisfies K×RI=R. Thus, as illustrated by D2 in FIG. 9B, the gain control by the AGC loop is performed such that the resonant point is positioned on the imaginary axis of the S plain surface, and thus the oscillation is inhibited from being stopped, or the drive signal DQB is inhibited from being turned into the rectangular wave signal. As a result, the vibrator 10 is able to be driven by the drive signal DQB of a sine wave, and thus the detection performance of the detection device is successfully improved.

6. Detailed Configuration Example of Driving Circuit

Figure 11:
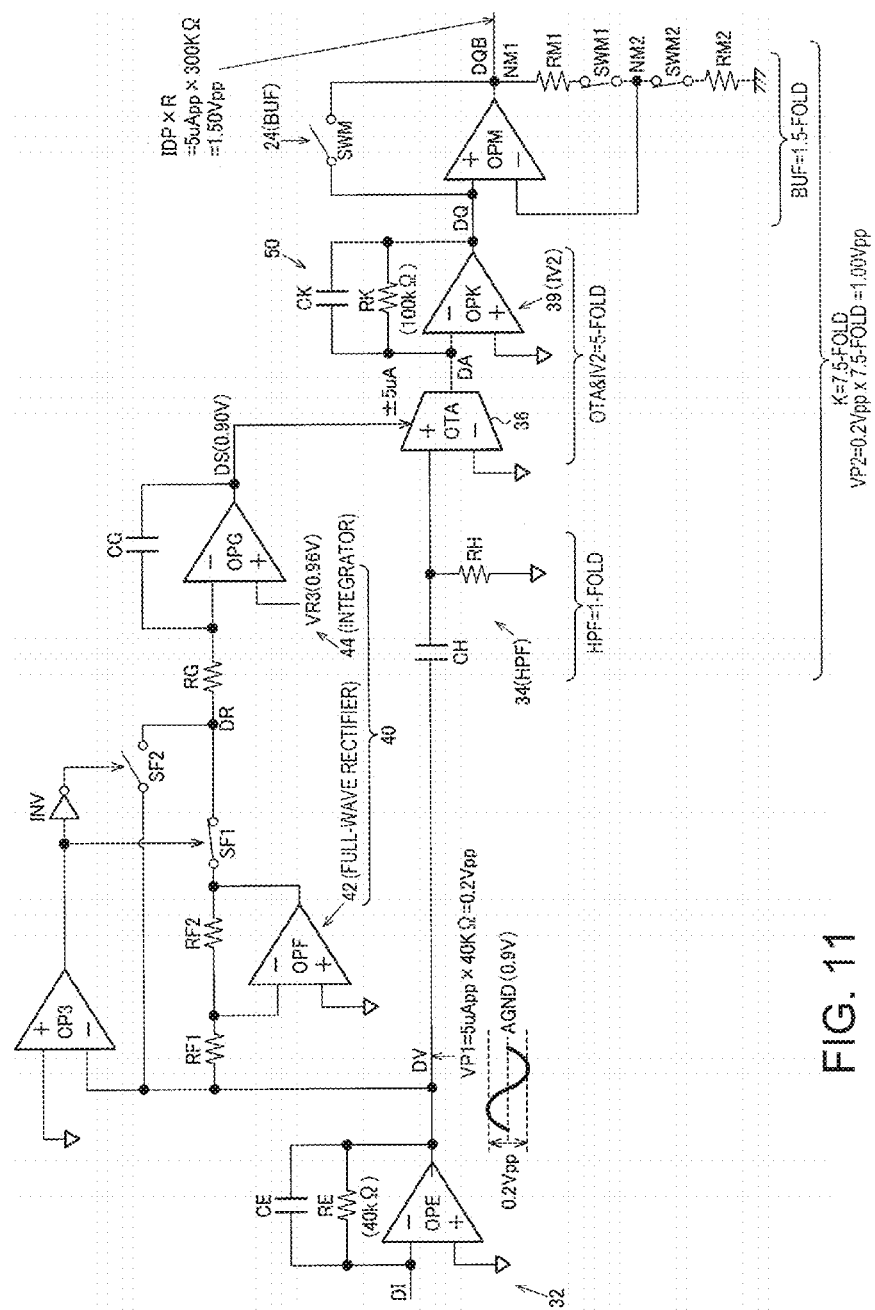
FIG. 11 is a detailed configuration example of the driving circuit which allows the vibrator to oscillate by the sine wave driving.

FIG. 11 illustrates a detailed configuration example of the driving circuit 30 at the time of using the sine wave driving.

In FIG. 11, the I/V conversion circuit 32 is an integral type current-voltage conversion circuit having lowpass filter properties, and includes the operational amplifier OPE, a capacitor CE, and the resistive element RE. Here, the resistance value of the resistive element RE is a resistance RI for a current-voltage conversion. A non-inversion input terminal (a first input terminal) of the operational amplifier OPE is set to a predetermined potential (for example, AGND), and the signal DI from the vibrator 10 is input to an inversion input terminal (a second input terminal). The capacitor CE and the resistive element RE are disposed between an output node of the I/V conversion circuit 32 and a node of the inversion input terminal of the operational amplifier OPE.

The gain control circuit 40 (AGC) is a circuit which automatically adjusts the gain such that the loop gain is 1 in a normal state of the oscillation, and includes a full-wave rectifier 42, and an integrator 44. Furthermore, the gain control circuit 40 may include an oscillation detector detecting an oscillation state, and the like.

The full-wave rectifier 42 performs a full-wave rectification with respect to the signal DV after being subjected to the I/V conversion of the I/V conversion circuit 32, and outputs a signal DR after being subjected to the full-wave rectification to the integrator 44. The full-wave rectifier 42 includes an operational amplifier OPF, resistive elements RF1 and RF2, a comparator CP3, switch elements SF1 and SF2, and an inverter circuit INV.

The resistive element RF1 is disposed between an input node of the signal DV and a node of an inversion input terminal of the operational amplifier OPF, and the resistive element RF2 is disposed between an output node of the operational amplifier OPF and the node of the inversion input terminal.

The switch element SF1 is disposed between the output node of the operational amplifier OPF and an input node of the integrator 44, and the switch element SF2 is disposed between a node of the signal DV and the input node of the integrator 44. Then, the switch elements SF1 and SF2 are exclusively ON and OFF controlled on the basis of an output signal of the comparator CP3 comparing the voltage of the signal DV with a voltage of a predetermined potential. Accordingly, the signal DR is a signal in which the signal DV is subjected to the full-wave rectification.

The integrator 44 outputs the control voltage DS of the amplitude of the drive signal DQ to the drive signal output circuit 50. Specifically, the integrator 44 performs an integral process with respect to the signal DR which is subjected to the full-wave rectification by the full-wave rectifier 42, and outputs the control voltage DS obtained by the integral process to the drive signal output circuit 50.

The integrator 44 includes an operational amplifier OPG, a resistive element RG, and a capacitor CG. The capacitor CG is disposed between an output node of the operational amplifier OPG and a node of an inversion input terminal of the operational amplifier OPG. A non-inversion input terminal of the operational amplifier OPG is set to a predetermined voltage VR3. The resistive element RG is disposed between an input node of the integrator 44 and the node of the inversion input terminal of the operational amplifier OPG.

Then, in this embodiment, the drive signal output circuit 50 includes an Operational Transconductance Amplifier (OTA) circuit 36, and an I/V conversion circuit 39 (a second current-voltage conversion circuit). Furthermore, a highpass filter 34 is disposed on an input stage side of the drive signal output circuit 50. The highpass filter 34 includes a resistive element RH, and a capacitor CH. Furthermore, the drive signal output circuit 50 is able to be variously changed by omitting a configuration of the highpass filter 34, by disposing a lowpass filter or the like instead of the highpass filter 34, and the like.

The OTA circuit 36 receives the control voltage DS from the gain control circuit 40, and an input voltage signal DV after being subjected to the I/V conversion by the I/V conversion circuit 32 (a signal after being subjected to a highpass filter process). Then, for example, a transconductance (Gm) is set in the OTA circuit 36 by the control voltage DS, and the OTA circuit 36 converts the input voltage signal DV into a current signal DA. The I/V conversion circuit 39 performs the I/V conversion (the current-voltage conversion) with respect to the current signal DA from the OTA circuit 36, and outputs the drive signal DQ.

The OTA circuit 36, for example, is a circuit which outputs a current proportional (approximately proportional) to an input voltage, and when a transconductance of the OTA circuit 36 is set to Gm, the OTA circuit 36 converts the input voltage signal DV into the current signal DA using Gm as a proportional constant. Then, the transconductance Gm of the OTA circuit 36 is set by the control voltage DS from the integrator 44, and thus the OTA circuit 36 converts the input voltage signal DV into the current signal DA using the transconductance Gm according to the control voltage DS. Then, the I/V conversion circuit 39 (IV2) converts the current signal DA from the OTA circuit 36 into the voltage signal, and outputs the voltage signal as the drive signal DQ. Accordingly, as a result, the drive signal output circuit 50 amplifies the input voltage signal DV with the gain according to the control voltage DS, and outputs the drive signal DQ.

Then, the buffer circuit 24 (BUF) receives the drive signal DQ from the drive signal output circuit 50, and outputs the drive signal DQB of a high amplitude in which the amplitude of the drive signal DQ increases to the vibrator 10.

However, in FIG. 11, a resistance for an I/V conversion is set to RI=40 KΩ. In FIG. 11, the resistance RI is a resistance value of a feedback resistive element RE of the I/V conversion circuit 32. In addition, a gain of the highpass filter 34 is 1-fold. Accordingly, when a peak-to-peak current of the feedback signal DI which is the input current signal is set to 5 μApp, a peak-to-peak voltage of the input voltage signal DV of the drive signal output circuit 50 is VP1=5 μApp×40 KΩ=0.2 Vpp. That is, an input voltage signal DV of a sine wave in which the peak-to-peak voltage is VP1=0.2 Vpp is input to the drive signal output circuit 50 with an analog based voltage (AGND) as a center voltage.

Then, a gain by the drive signal output circuit 50 and the buffer circuit 24 is K=7.5-fold. For example, a gain of the drive signal output circuit 50 (the OTA circuit 36, the I/V conversion circuit 39, and the highpass filter 34) is 5-fold, and a gain of the buffer circuit 24 is 1.5-fold, and thus a gain is K=7.5-fold in total. Accordingly, a sine wave signal in which the peak-to-peak voltage is VP2=VP1×K=0.2 Vpp× 7.5=1.50 Vpp is output as the drive signal DQB.

On the other hand, a peak-to-peak current of the drive current of the vibrator 10 is set to IDR=5 μA, and the equivalent series resistance of the vibrator 10 is R=300 KΩ. Accordingly, from a viewpoint of a drive current, the peak-to-peak voltage of the drive signal DQ is VP2=5 μA×300 KΩ=1.50 Vpp. This is coincident with VP2=VP1×K=0.2 Vpp×7.5=1.50 Vpp described above which is obtained from the gain K=7.5-fold.

Thus, in FIG. 11, when the peak-to-peak voltage of the input voltage signal DV is set to VP1, the peak-to-peak voltage of the drive signal DQB is set to VP2, and the peak-to-peak current of the drive current of the vibrator 10 which is set by the AGC loop of the gain control circuit 40 is set to IDP, a relationship of VP2=K×VP1=IDP×R is satisfied. This indicates that the relationships of K×RI=R and R+RN=0 described above are satisfied. For example, K=7.5-fold, RI=40 KΩ, and R=300 KΩ, and K×RI=7.5×40 KΩ=R is satisfied. Accordingly, it is possible to realize suitable sine wave driving described by D2 in FIG. 9B or FIG. 10C.

In addition, in FIG. 11, when a voltage difference between the high potential side power-supply voltage VDD and the low potential side power-supply voltage VSS (GND) is set to VDS, a relationship of VDS>VP2=K×VP1=IDP×R is satisfied. This indicates that the drive signal DQB is not a rectangular wave signal of which the amplitude exceeds the voltage difference VDS of VDD to VSS, but a sine wave signal of which the amplitude does not exceed the voltage difference VDS.

For example, at the time of rectangular wave driving, the drive signal output circuit 50 is configured by the comparator, and outputs the drive signal of a rectangular wave.

Figure 12:
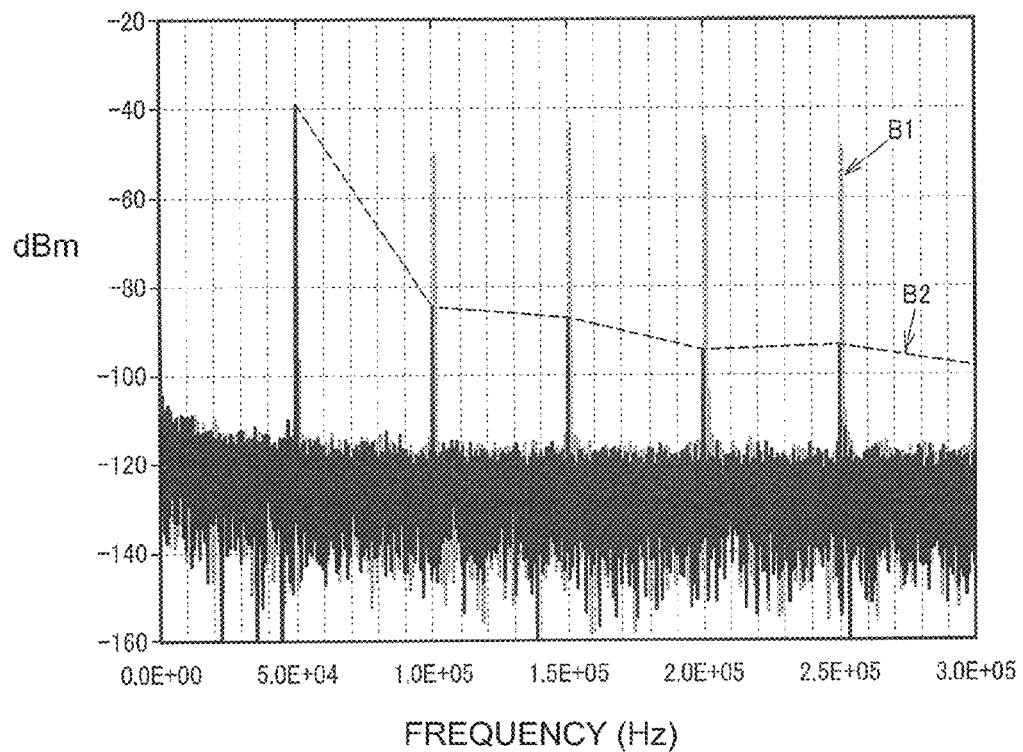
FIG. 12 is an explanatory view of a reduction of a harmonic component by the sine wave driving.

Then, in the rectangular wave driving, as illustrated by frequency properties of a spectrum diagram of the drive signal illustrated in FIG. 12, a harmonic component as illustrated by B1 appears, and thus the detection performance of the detection device is degraded. In contrast, according to a configuration of FIG. 11, frequency properties as illustrated by B2 in FIG. 12 are shown, and the harmonic component is reduced compared to a case of the rectangular wave driving, and thus it is possible to improve the detection performance of the detection device.

Figure 13:
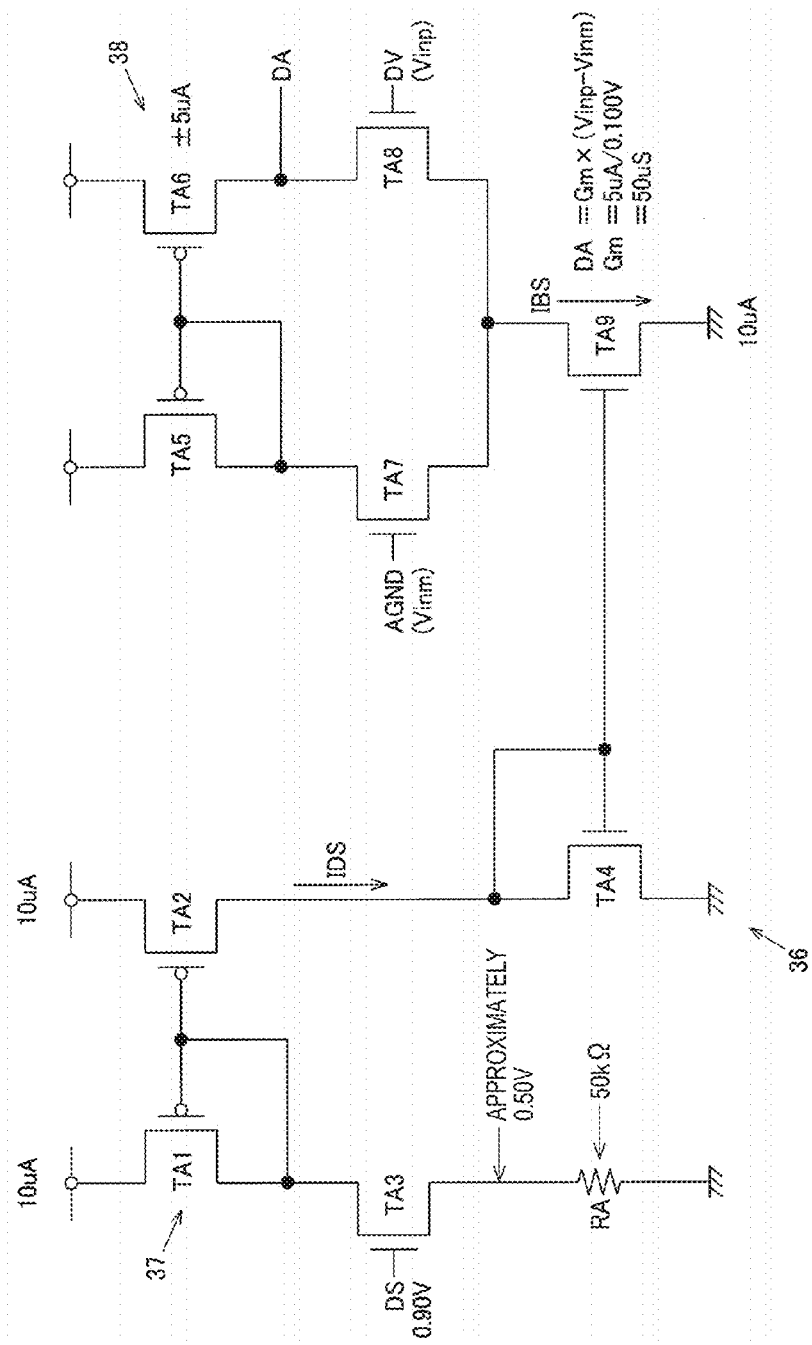
FIG. 13 is a detailed configuration example of an OTA circuit.

FIG. 13 illustrates a specific configuration example of the OTA circuit 36. The OTA circuit 36 includes a V/I conversion circuit 37 (a voltage-current conversion circuit), and a differential unit 38. Furthermore, a configuration of the OTA circuit 36 is not limited to a configuration illustrated in FIG. 13, but is able to be variously changed.

The V/I conversion circuit 37 converts the control voltage DS from the gain control circuit 40 to a control current IDS. The V/I conversion circuit 37 is configured by transistors TA1, TA2, TA3, and TA4, and a resistive element RA. Gates of the P type transistors TA1 and TA2 are commonly connected to each other. A drain of the N type transistor TA3 is connected to a drain of the transistor TA1, the control voltage DS is input into a gate thereof, and a source thereof is connected to one end of the resistive element RA. A drain and a gate of the N type transistor TA4 are connected to a drain of the transistor TA2.

In the differential unit 38, a bias current IBS set by the control current IDS flows to a bias current source (TA9), the analog based voltage (AGND) is input to a first differential input terminal (an inversion input terminal), and the input voltage signal DV is input to a second differential input terminal (a non-inversion input terminal). Then, the current signal DA is output to the I/V conversion circuit 39 (the second current-voltage conversion circuit).

The differential unit 38 is configured by transistors TA5, TA6, TA7, TA8, and TA9. Gates of the P type transistors TA5 and TA6 are commonly connected to each other. A drain of the N type transistor TA7 is connected to a drain of the transistor TA5, AGND is input into a gate thereof, and a source thereof is connected to a drain of the transistor TA9. A drain of the N type transistor TA8 is connected to a drain of the transistor TA6, the input voltage signal DV is input into a gate thereof, and a source thereof is connected to the drain of the transistor TA9. The N type transistor TA9 is a transistor which is a bias current source, and a gate thereof and a gate of the transistor TA4 of the V/I conversion circuit 37 are commonly connected to each other. The bias current IBS flowing to the transistor TA9 is a current in which the control current IDS created by the V/I conversion circuit 37 is set to a current mirror.

In FIG. 13, when the control voltage DS is 0.9 V, a source voltage of the transistor TA3 is approximately 0.5 V, and a current of 10 µA flows through resistive element RA. Accordingly, a current of IDS=10 µA flows as the control current. By the control current IDS, a current of IBS=10 µA flows through the differential unit 38 as a bias current. Then, by setting the bias current IBS in this way, the OTA circuit 36 is able to output a current signal DA of a sine wave of ±5 µA.

On the other hand, as illustrated in FIG. 11, AGND=0.9 V, and the input voltage signal DV is a signal in which the peak-to-peak voltage with AGND as the center voltage is VP1=0.2 Vpp, and is a voltage signal of a sine wave of ±0.1 V. Accordingly, the transconductance Gm is set to 5 µA/(Vinp−Vinm)=5 µA/0.1 V=50 µS.

In a configuration of FIG. 13, the control current IDS is set by the control voltage DS from the integrator 44, and the bias current IBS flowing through the differential unit 38 is set. Then, by the bias current IBS, a transconductance Gm of the OTA circuit 36 is set. That is, when the control voltage DS increases and decreases, the control current IDS and the bias current IBS increase and decrease, and thus the transconductance Gm also increases and decreases. Then, the OTA circuit 36 converts the input voltage signal DV into the current signal DA using the transconductance Gm which is set by the control voltage DS. Then, the I/V conversion circuit 39 performs the I/V conversion with respect to the current signal DA, and outputs the drive signal DQ. Then, the buffer circuit 24 outputs the drive signal DQB of a high amplitude in which the amplitude of the drive signal DQ increases. Thus, a drive signal DQB of a sine wave in which the amplitude (the peak-to-peak voltage) is subjected to an AGC control by the control voltage DS is able to be output to the vibrator 10.

7. Modification Example

Figure 14:
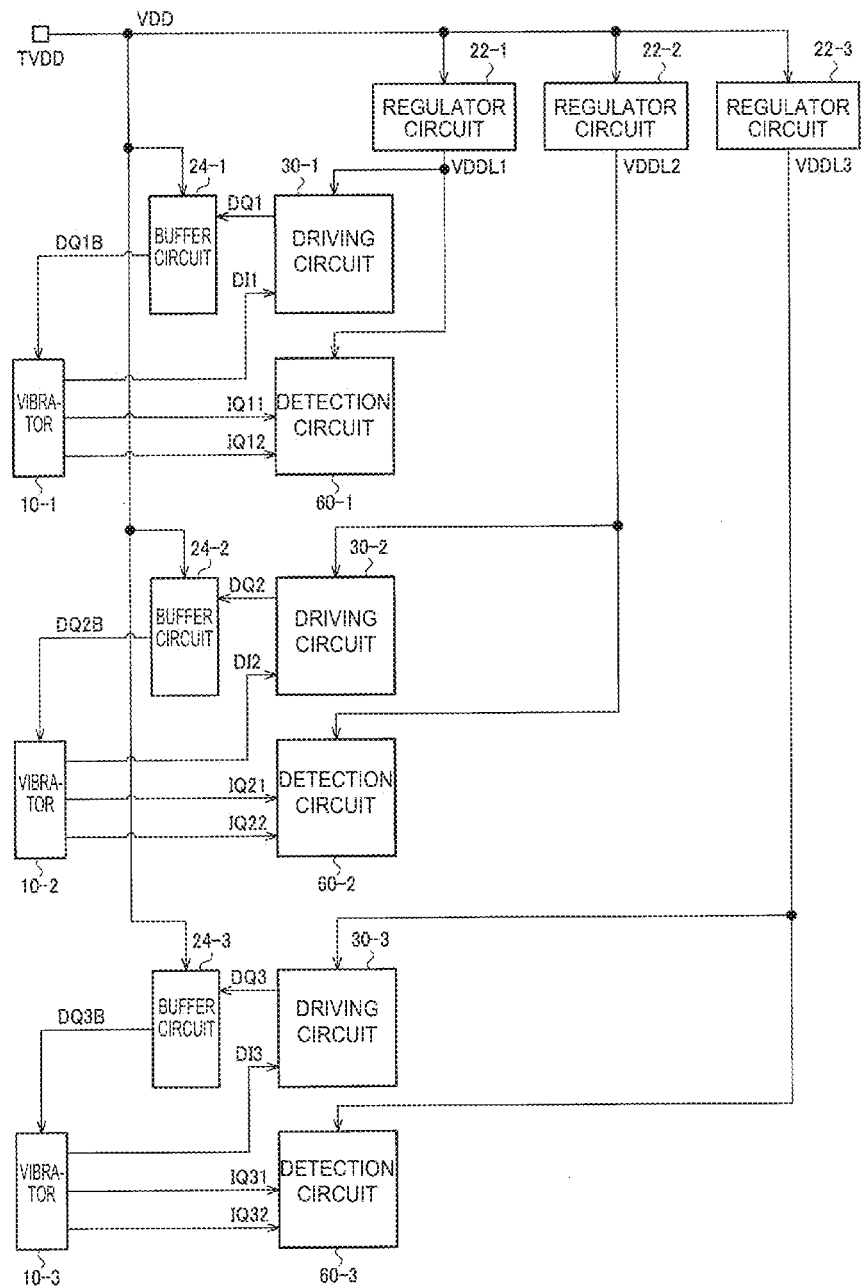
FIG. 14 is another configuration example of the detection device according to this embodiment.

FIG. 14 illustrates a modification example of the detection device according to this embodiment. FIG. 14 is a configuration example of the detection device of a multiaxis gyroscope sensor which detects a rotation angular velocity around a plurality of axes. The detection device of the configuration example drives and detects a plurality of vibrators 10-1, 10-2, and 10-3. Here, for example, the vibrator 10-1 is a vibrator for detecting a rotation angular velocity around a first axis (for example, an X axis), and the vibrator 10-2 is a vibrator for detecting a rotation angular velocity around a second axis (for example, a Y axis). In addition, the vibrator 10-3 is a vibrator for detecting a rotation angular velocity around a third axis (for example, a Z axis).

In the multiaxis gyroscope sensor, there is a problem of a so-called interaxial interference. For example, as a method of a comparative example of this embodiment, a method in which the entire circuit of the detection device is operated by the power-supply voltage VDD as the operating power-supply voltage is considered. However, in the method of the comparative example, for example, the interaxial interference in which a minute variation in the power-supply voltage VDD occurring by operating the a driving circuit for a first axis and the detection circuit, or the like adversely affects a driving circuit for a second axis, a driving circuit for a third axis, and the detection circuit occurs, and thus the detection performance may be degraded, and the like. In particular, when drive frequencies of the plurality of vibrators are different from each other, the problem is serious. In order to solve the problem, a configuration illustrated in FIG. 14 is adopted in this embodiment.

Specifically, in FIG. 14, a regulator circuit 22-1 for a vibrator 10-1, a buffer circuit 24-1, a driving circuit 30-1, a detection circuit 60-1, a regulator circuit 22-2 for a vibrator 10-2, a buffer circuit 24-2, a driving circuit 30-2, and a detection circuit 60-2 are disposed. In addition, a regulator circuit 22-3 for a vibrator 10-3, a buffer circuit 24-3, a driving circuit 30-3, and a detection circuit 60-3 are disposed. Furthermore, FIG. 14 is an example of a case where the number of vibrators is 3, and when the number of vibrators is 2, a configuration of the regulator circuit 22-3 for a vibrator 10-3, the buffer circuit 24-3, the driving circuit 30-3, and the detection circuit 60-3 is not necessary.

A configuration and an operation of the regulator circuit 22-1 for a vibrator 10-1, the buffer circuit 24-1, the driving circuit 30-1, and the detection circuit 60-1 are identical to those of the regulator circuit 22, the buffer circuit 24, the driving circuit 30, and the detection circuit 60 of FIG. 2, and thus the detailed description will be omitted.

The driving circuit 30-2 for a vibrator 10-2 (a second driving circuit) receives a feedback signal DI2 (a second feedback signal) from the vibrator 10-2 (a second physical quantity transducer), and drives the vibrator 10-2. The detection circuit 60-2 (a second detection circuit) receives detection signals IQ21 and IQ22 from the vibrator 10-2, and detects a desired signal.

The regulator circuit 22-2 (a second regulator circuit) performs a voltage adjustment of stepping down the power-supply voltage VDD from the power-supply terminal TVDD, and outputs a regulated power-supply voltage VDDL2 (a second regulated power-supply voltage) obtained by the voltage adjustment to the driving circuit 30-2 and the detection circuit 60-2.

Then, the buffer circuit 24-2 (a second buffer circuit) is supplied with the power-supply voltage VDD, receives a drive signal DQ2 (a second drive signal) from the driving circuit 30-2, and outputs a drive signal DQ2B (a second amplified drive signal) of a high amplitude in which an amplitude of the drive signal DQ2 increases to the vibrator 10-2.

The driving circuit 30-3 (a third driving circuit) for a vibrator 10-3 receives a feedback signal D13 (a third feedback signal) from the vibrator 10-3 (a third physical quantity transducer), and drives the vibrator 10-3. The detection circuit 60-3 (a third detection circuit) receives detection signals 1Q31 and 1Q32 from the vibrator 10-3, and detects a desired signal.

The regulator circuit 22-3 (a third regulator circuit) performs a voltage adjustment of stepping down the power-supply voltage VDD from the power-supply terminal TVDD, and outputs a regulated power-supply voltage VDDL3 (a third regulated power-supply voltage) obtained by the voltage adjustment to the driving circuit 30-3 and the detection circuit 60-3.

Then, the buffer circuit 24-3 (a third buffer circuit) is supplied with the power-supply voltage VDD, receives a drive signal DQ3 (a third drive signal) from the driving circuit 30-3, and outputs a drive signal DQ3B (a third amplified drive signal) of a high amplitude in which an amplitude of the drive signal DQ3 increases to the vibrator 10-3.

According to a configuration of FIG. 14 described above, the voltage adjustment of stepping down the power-supply voltage VDD is performed in the regulator circuits 22-1, 22-2, and 22-3. Then, the obtained regulated power-supply voltages VDDL1, VDDL2, and VDDL3 are respectively supplied to the driving circuit 30-1 and the detection circuit 60-1, the driving circuit 30-2 and the detection circuit 60-2, the driving circuit 30-3 and the detection circuit 60-3, as the operating power-supply voltage. Accordingly, it is possible to suppress the interaxial interference to a minimum. For example, it is possible to inhibit a power-supply voltage variation by an operation of the driving circuit 30-1 for a first axis and the detection circuit 60-1 from being transferred to the driving circuit 30-2 for a second axis, the driving circuit 30-3 for a third axis, and the detection circuits 60-2 and 60-3 by the regulator circuits 22-1, 22-2, and 22-3 to a minimum. Accordingly, the interaxial interference of the multiaxis gyroscope sensor is reduced, and thus the detection performance is improved.

Then, in FIG. 14, the buffer circuits 24-1, 24-2, and 24-3 are operated not by the regulated power-supply voltage but by the power-supply voltage VDD which is input from the outside by the terminal TVDD, and create the drive signals DQ1B, DQ2B, and DQB3 of a high amplitude. Accordingly, it is possible to realize shortening of the start-up time by driving of a high amplitude, and improvement of the detection performance by reduction of the interaxial interference together.

In addition, in FIG. 14, the detection device outputs a drive signal DQ1B of a high amplitude from the buffer circuit 24-1 in the first mode described in FIG. 5A, and outputs the signal to the vibrator 10-1. Similarly, the detection device outputs the drive signals DQ2B and DQ3B of a high amplitude from the buffer circuits 24-2 and 24-3 to the vibrators 10-2 and 10-3 in the first mode.

In contrast, in the second mode described in FIG. 5B, the detection device outputs the drive signal DQ1 of a low amplitude from the driving circuit 30-1 to the vibrator 10-1. Similarly, the detection device outputs the drive signals DQ2 and DQ3 of a low amplitude from the driving circuits 30-2 and 30-3 to the vibrators 10-2 and 10-3 in the second mode.

For example, in the start-up period of the oscillation, a desired signal is not detected, and thus the interaxial interference described above is not a serious problem. Accordingly, in the start-up period, the detection device is set to the first mode, and drives the vibrators 10-1 to 10-3 by the drive signals DQ1B to DQ3B of a high amplitude. In contrast, after the start-up period of the oscillation is completed, in order to inhibit the detection performance from being degraded due to the interaxial interference or the like, the detection device drives the vibrators 10-1, 10-2, and 10-3 by the drive signals DQ1 to DQ3 of a low amplitude. Thus, it is possible to realize shortening of the start-up time of the oscillation, and improvement of the detection performance together in the multiaxis gyroscope sensor or the like.

8. Detection Circuit

Figure 15:
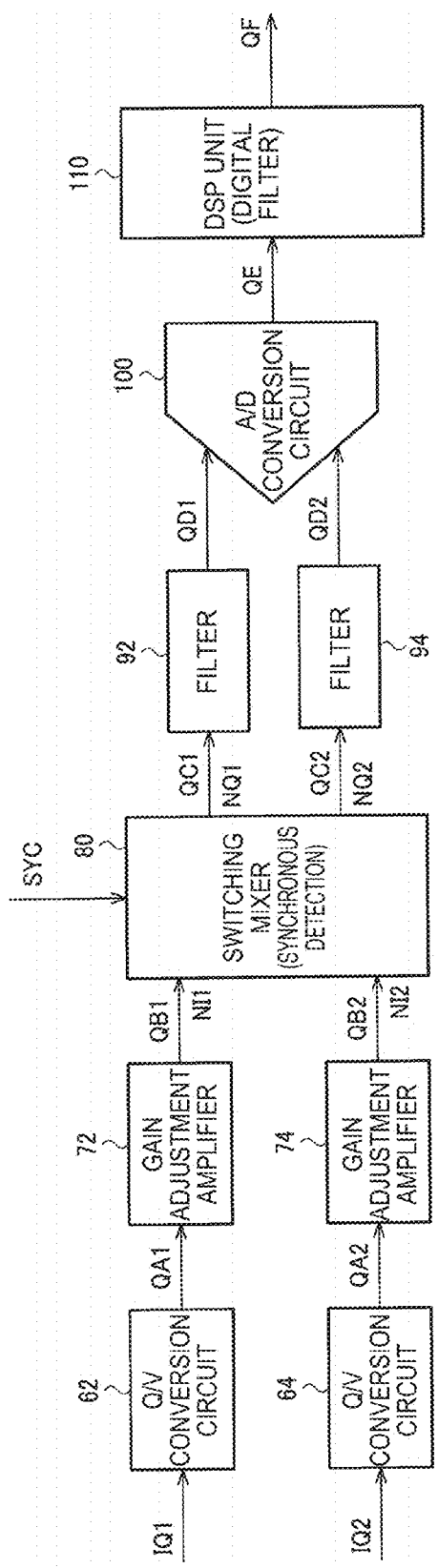
FIG. 15 is a configuration example of a detection circuit.

FIG. 15 illustrates a detailed configuration example of the detection circuit 60. FIG. 15 is an example of a full differential switching mixer type detection circuit 60.

As illustrated in FIG. 15, the full differential switching mixer type detection circuit 60 includes a first Q/V conversion circuit 62, a second Q/V conversion circuit 64, a first gain adjustment amplifier 72, a second gain adjustment amplifier 74, a switching mixer 80, a first filter 92, a second filter 94, an A/D conversion circuit 100, and a DSP unit 110 (a digital signal processing unit).

A first differential detection signal IQ1 and a second differential detection signal IQ2 from the vibrator 10 are input into the Q/V conversion circuits 62 and 64 (an electric charge-voltage conversion circuit). Then, the Q/V conversion circuits 62 and 64 convert an electric charge (a current) generated by the vibrator 10 into a voltage.

The gain adjustment amplifiers 72 and 74 amplify output signals QA1 and QA2 of the Q/V conversion circuits 62 and 64 by performing a gain adjustment with respect to the output signal. The gain adjustment amplifiers 72 and 74 are a so-called programmable gain amplifier, and amplify the signals QA1 and QA2 using a gain set by the control unit 140. For example, the gain adjustment amplifiers 72 and 74 amplify the signals QA1 and QA2 to a signal of an amplitude suitable for a voltage conversion range of the A/D conversion circuit 100.

The switching mixer 80 is a mixer which performs a differential synchronous detection on the basis of the synchronization signal SYC from the driving circuit 30. Specifically, in the switching mixer 80, an output signal QB1 of the gain adjustment amplifier 72 is input into a first input node NI1, and an output signal QB2 of the gain adjustment amplifier 74 is input into a second input node NI2. Then, the differential synchronous detection is performed by the synchronization signal SYC from the driving circuit 30, and the first differential output signal QC1 and the second differential output signal QC2 are output to the first output node NQ1 and the second output node NQ2. By the switching mixer 80, an unnecessary signal such as noise (1/f noise) occurring in the previous circuit (the Q/V conversion circuit, the gain adjustment amplifier) is frequency converted into a high frequency band. In addition, a desired signal which is a signal according to the Coriolis force is dropped into a direct current signal.

A first output signal QC1 from the first output node NQ1 of the switching mixer 80 is input into the filter 92. A second output signal QC2 from the second output node NQ2 of the switching mixer 80 is input into the filter 94. The filters 92 and 94, for example, are lowpass filters having frequency properties which allow the desired signal to pass through the filter by eliminating (attenuating) the unnecessary signal. For example, the unnecessary signal such as the 1/f noise which is frequency converted into a high frequency band by the switching mixer 80, is eliminated by the filters 92 and 94. In addition, the filters 92 and 94 are a passive filter which is configured by a passive element such as a resistive element or a capacitor without using the operational amplifier.

The A/D conversion circuit 100 receives the output signal QD1 from the filter 92 and the output signal QD2 from the filter 94, and performs a differential A/D conversion. Specifically, the A/D conversion circuit 100 performs the A/D conversion by sampling the output signals QD1 and QD2 using the filters 92 and 94 as a filter for anti aliasing (a prefilter). Then, in this embodiment, the output signal QD1 from the filter 92 and the output signal QD2 from the filter 94 are input into the A/D conversion circuit 100 without using the active element. As the A/D conversion circuit 100, for example, various types of A/D conversion circuits such as a $\Delta$ sigma type A/D conversion circuit or a sequential comparison type A/D conversion circuit are able to be adopted. When the $\Delta$ sigma type A/D conversion circuit is adopted, for example, the $\Delta$ sigma type A/D conversion circuit has a function of Correlated Double Sampling (CDS) or a chopper for reducing the 1/f noise, or the like, and for example, an A/D conversion circuit which is configured by a secondary $\Delta$ sigma modulator or the like is able to be used.

The Digital Signal Processing (DSP) unit 110 performs various digital signal processes. For example, the DSP unit 110, for example, performs a digital filter process of a band limitation according to an application of the desired signal, or a digital filter process of eliminating the noise occurring by the A/D conversion circuit 100 or the like. In addition, the DSP unit 110 performs a digital correction process such as a gain correction (a sensitivity adjustment), and an offset correction.

In the detection circuit 60 of FIG. 15, a full differential switching mixer type detection circuit is adopted. That is, the differential detection signals IQ1 and IQ2 from the vibrator 10 are subjected to a signal amplification or a gain adjustment by the Q/V conversion circuits 62 and 64, and the gain adjustment amplifiers 72 and 74, and input into the switching mixer 80 as the differential signals QB1 and QB2. Then, the switching mixer 80 performs a synchronous detection process by which the unnecessary signal is frequency converted into a high frequency band with respect to the differential signals QB1 and QB2. Then, the unnecessary signal which is frequency converted into a high frequency band is eliminated by the filters 92 and 94, and input into the A/D conversion circuit 100 as the differential signals QD1 and QD2, and thus the differential A/D conversion is performed.

According to the full differential switching mixer type detection circuit 60, the 1/f noise occurring by the Q/V conversion circuits 62 and 64, or the gain adjustment amplifiers 72 and 74, or the like is eliminated by a frequency conversion of the switching mixer 80, and by the lowpass filter properties of the filters 92 and 94. Then, the switching mixer 80 in which there is no gain, but less noise occurs (the 1/f noise does not occur), or the filters 92 and 94 which are configured by a passive element of low noise are disposed between the gain adjustment amplifiers 72 and 74 and the A/D conversion circuit 100. Accordingly, the noise occurring by the Q/V conversion circuits 62 and 64, or the gain adjustment amplifiers 72 and 74 is eliminated, and the noise occurring by the switching mixer 80 or the filters 92 and 94 is also suppressed to a minimum, and thus the signals QD1 and QD2 in a low noise state are input into the A/D conversion circuit 100, and are able to be subjected to the A/D conversion. In addition, the signals QD1 and QD2 are subjected to the A/D conversion as the differential signal, and thus it is possible to further improve an S/N ratio compared to a case where the A/D conversion is performed by a single end signal.

Furthermore, the detection circuit 60 of this embodiment is not limited to the full differential switching mixer type detection circuit illustrated in FIG. 15. For example, various types of detection circuits 60 such as a direct sampling type detection circuit illustrated in FIG. 16A, and an analog synchronous detection type detection circuit illustrated in FIG. 16B are able to be adopted.

Figure 16:
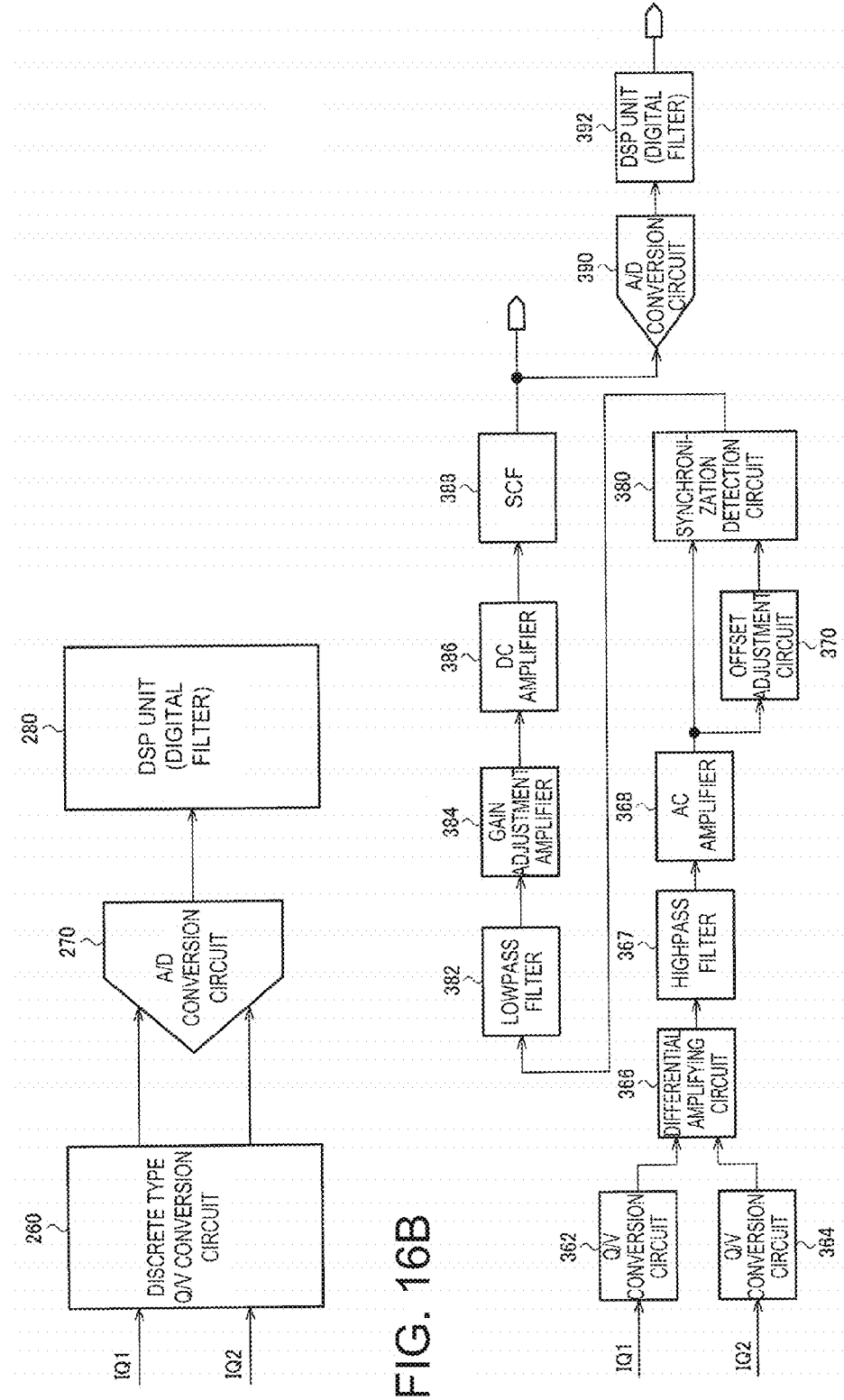
FIGS. 16A and 16B are other configuration examples of the detection circuit.

The direct sampling type detection circuit 60 of FIG. 16A includes a discrete type Q/V conversion circuit 260, an A/D conversion circuit 270, and a DSP unit 280. The direct sampling type detection circuit is a dominant configuration in terms of downsizing of the circuit. However, there is no filter for anti aliasing in a previous stage of the A/D conversion circuit 270, and thus it is difficult to avoid performance degradation due to folding noise. In response, in the full differential switching mixer type detection circuit of FIG. 15, the Q/V conversion circuits 62 and 64 are a continuous electric charge-voltage conversion circuit including a feedback resistive element, and thus it is possible to prevent the performance degradation due to the folding noise occurring in the direct sampling type detection circuit, and it is possible to realize a detection process of low noise in a small-scale circuit configuration.

The analog synchronous detection type detection circuit 60 of FIG. 16B includes Q/V conversion circuits 362 and 364, a differential amplifying circuit 366, a highpass filter 367, an AC amplifier 368, an offset adjustment circuit 370, a synchronization detection circuit 380, a lowpass filter 382, a gain adjustment amplifier 384, a DC amplifier 386, and a switched capacitor filter (SCF) 388. In addition, for example, as an external circuit of the detection device, an A/D conversion circuit 390, and a DSP unit 392 (a digital filter) are disposed.

In the analog synchronous detection type detection circuit, for example, a gain of a signal in the detection circuit 60 increases, and thus it is possible to improve noise properties. However, the number of circuit blocks increases, and the circuit is upsized, or the number of analog circuit blocks which consume a lot of current increases, and thus power consumption may be excessive. In response, the full differential switching mixer type detection circuit of FIG. 15 decreases the number of circuit blocks compared to the analog synchronous detection type detection circuit, and thus it is possible to easily realize downsizing of the circuit or reducing of the power consumption. In addition, in the full differential switching mixer type detection circuit, the differential signals IQ1 and IQ2 from the vibrator 10 are subjected to a gain adjustment, a synchronous detection process, and a filter process in a state of the differential signal, and input into the A/D conversion circuit 100, and thus the A/D conversion is performed. For this reason, a configuration which is advantageous in noise reduction is realized compared to the analog synchronous detection type detection circuit in which the filter process, the synchronous detection process, the gain adjustment process, and the like are performed in a state of the single end signal.

Furthermore, the gyroscope sensor 510 (a sensor) of this embodiment, for example, is able to be assembled in various moving objects such as a car, an airplane, a motorcycle, a bicycle, and a vessel. The moving object, for example, includes a drive mechanism such as an engine or a motor, a steering mechanism such as a handle or a rudder, and various electronic apparatuses, and equipment and a device which are moved on the ground, in the sky, or in the sea.

Figure 17:
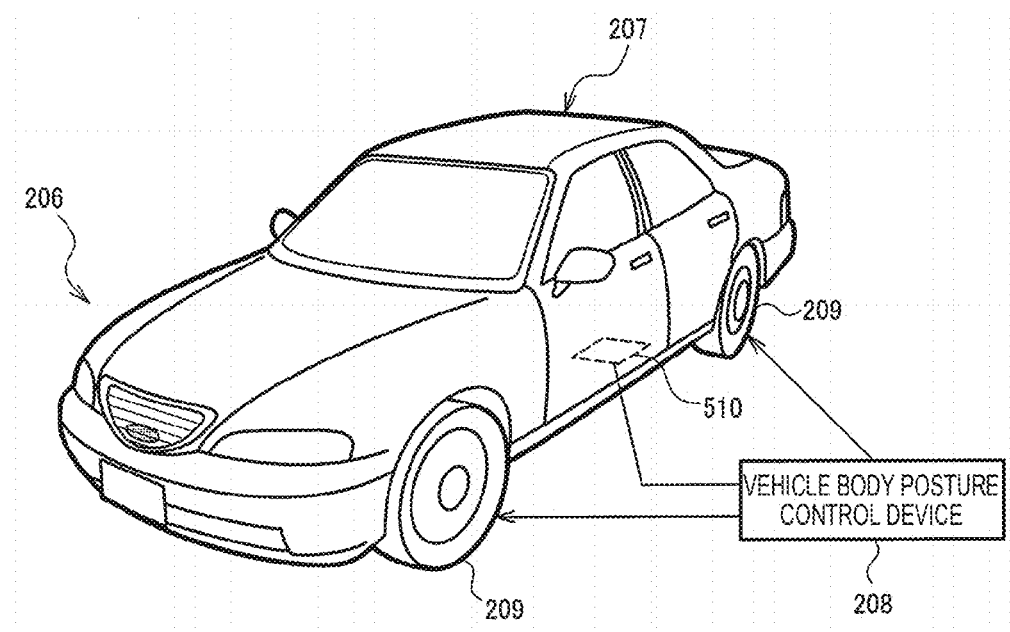
FIG. 17 is a conceptual diagram schematically illustrating a configuration of an automobile as a specific example of a moving object.

FIG. 17 schematically illustrates an automobile 206 as a specific example of the moving object. In the automobile 206, the gyroscope sensor 510 including the vibrator 10 and the detection device 20 is assembled. The gyroscope sensor 510 is able to detect a posture of a vehicle body 207. The detection signal of the gyroscope sensor 510 is able to be supplied to a vehicle body posture control device 208. The vehicle body posture control device 208, for example, is able to control hardness of a suspension according to a posture of the vehicle body 207 or to control a brake of each wheel 209. In addition, the posture control is able to be used in various moving objects such as a bipedal robot or an aircraft, a helicopter, and the like. The gyroscope sensor 510 is able to be assembled at the time of realizing the posture control.

Furthermore, as described above, this embodiment has been described in detail, but a person having ordinary skill in the art will easily understand that various modifications which are not substantially deviated from new matters and effects of the invention are possible. Accordingly, all the modification examples are within the scope of the invention. For example, in the description or in the drawings, the terms (the gyroscope sensor, the vibrator, the angular velocity information, and the like) described at least once along with different terms (the sensor, the physical quantity transducer, the physical quantity, and the like) having the broad meaning or the same meaning are able to be substituted by the different terms in any portion of the description or in the drawings. In addition, a configuration of the detection device, the sensor, the electronic apparatus, or the moving object, and a structure of the vibrator are not limited to the description in this embodiment, and are able to be variously changed.

The entire disclosure of Japanese Patent Application No. 2013-231343, filed Nov. 7, 2013 is expressly incorporated by reference herein.

What is claimed is:

1. A detection device, comprising:
a driving circuit which receives a feedback signal from a physical quantity transducer, and drives the physical quantity transducer, and wherein the driving circuit amplifies a signal based on the feedback signal and outputs the amplified signal, as a drive signal;
a detection circuit which receives a detection signal from the physical quantity transducer, and detects a desired signal;
a power-supply terminal into which a power-supply voltage is input;
a regulator circuit which performs a voltage adjustment of stepping down the power-supply voltage from the power-supply terminal, and supplies a regulated power-supply voltage obtained by the voltage adjustment to the driving circuit and the detection circuit as an operating power-supply voltage; and
a buffer circuit receives the power-supply voltage, and receives the drive signal from the driving circuit, wherein the buffer circuit is operable to output an amplified drive signal in which an amplitude of the drive signal increases to the physical quantity transducer.

2. The detection device according to claim 1,
wherein the amplified drive signal from the buffer circuit is output to the physical quantity transducer in a first mode, and
the drive signal from the driving circuit is output to the physical quantity transducer in a second mode.

3. The detection device according to claim 2,
wherein the physical quantity transducer is a vibrator, and
the detection device is set to the first mode in a start-up period of oscillation of the vibrator, and the amplified drive signal from the buffer circuit is output to the vibrator.

4. The detection device according to claim 3,
wherein the detection device is set to the second mode after the start-up period is completed, and the drive signal from the driving circuit is output to the vibrator.

5. A sensor, comprising:
the detection device according to claim 2; and
the physical quantity transducer.

6. A sensor, comprising:
the detection device according to claim 3; and
the physical quantity transducer.

7. An electronic apparatus comprising the detection device according to claim 2.

8. The detection device according to claim 1,
wherein the buffer circuit includes
an operational amplifier in which the drive signal from the driving circuit is input into a non-inversion input terminal, and
a first resistive element and a second resistive element which are disposed between an output node of the operational amplifier and a node of a low potential side electric power supply in series, and
a connection node between the first resistive element and the second resistive element is connected to an inversion input terminal of the operational amplifier.

9. The detection device according to claim 1,
wherein the driving circuit and the detection circuit are configured by a transistor of a first pressure resistance, and
the buffer circuit is configured by a transistor of a second pressure resistance which is a pressure resistance higher than the first pressure resistance.

10. The detection device according to claim 1,
wherein the physical quantity transducer is a vibrator, the driving circuit includes
a current-voltage conversion circuit which receives the feedback signal, and performs a current-voltage conversion,
a drive signal output circuit which amplifies an input voltage signal after being subjected to the current-voltage conversion by the current-voltage conversion circuit, and outputs the drive signal of a sine wave, and
a gain control circuit which controls a gain of amplification of the drive signal in the drive signal output circuit, and
when a resistance for a current-voltage conversion of the current-voltage conversion circuit is set to RI, the gain of the amplification of the drive signal by the drive signal output circuit and the buffer circuit is set to K, and an equivalent series resistance in a fundamental wave mode of the vibrator is set to R, the gain control circuit performs a gain control such that $K \times RI = R$ is satisfied.

11. The detection device according to claim 10,
wherein the drive signal output circuit includes
an Operational Transconductance Amplifier (OTA) circuit in which a transconductance is set by a control voltage from the gain control circuit, and the input voltage signal is converted into a current signal, and
a second current-voltage conversion circuit which performs a current-voltage conversion with respect to the current signal from the OTA circuit, and outputs the drive signal.

12. The detection device according to claim 11,
wherein the OTA circuit includes
a voltage-current conversion circuit which converts the control voltage from the gain control circuit into a control current, and
a differential unit in which a bias current set by the control current flows to a bias current source, an analog based voltage is input into a first differential input terminal, an input voltage signal is input into a second differential input terminal, and the current signal is output to the second current-voltage conversion circuit.

13. The detection device according to claim 1, further comprising:
a second driving circuit which receives a second feedback signal from a second physical quantity transducer, and drives the second physical quantity transducer;
a second detection circuit which receives a second detection signal from the second physical quantity transducer, and detects a desired signal;
a second regulator circuit which performs a voltage adjustment of stepping down the power-supply voltage from the power-supply terminal, and supplies a second regulated power-supply voltage obtained by the voltage adjustment to the second driving circuit and the second detection circuit; and
a second buffer circuit which is supplied with the power-supply voltage, receives a second drive signal from the second driving circuit, and outputs a second amplified drive signal in which an amplitude of the second drive signal increases to the second physical quantity transducer.

14. The detection device according to claim 13,
wherein the amplified drive signal from the buffer circuit is output to the physical quantity transducer, and the second amplified drive signal from the second buffer circuit is output to the second physical quantity transducer in a first mode, and
the drive signal from the driving circuit is output to the physical quantity transducer, and the second drive signal from the second driving circuit is output to the second physical quantity transducer in a second mode.

15. The detection device according to claim 13,
wherein the physical quantity transducer is a vibrator for detecting a rotation angular velocity around a first axis, and
the second physical quantity transducer is a vibrator for detecting a rotation angular velocity around a second axis.

16. A sensor, comprising:
the detection device according to claim 1; and
the physical quantity transducer.

17. An electronic apparatus comprising the detection device according to claim 1.

18. A moving object comprising the detection device according to claim 1.

19. A detection device, comprising:
a driving circuit that receives a feedback signal from a physical quantity transducer, wherein the driving circuit amplifies a signal based on the feedback signal and outputs the amplified signal as a drive signal;
a detection circuit that receives a detection signal from the physical quantity transducer, and detects a desired signal;
a power-supply terminal into which a power-supply voltage is input;
a regulator circuit that adjusts a voltage of the power-supply voltage, wherein the regulator circuit reduces the power-supply voltage from the power-supply terminal, and supplies the reduced voltage to the driving circuit and the detection circuit as an operating power-supply voltage; and
a buffer circuit that receives the power-supply voltage and receives the drive signal from the driving circuit, wherein the buffer circuit amplifies the drive signal from the driving circuit, and wherein, the physical quantity transducer is driven by one of the drive signal from the driving circuit or the amplified drive signal from the buffer circuit.

20. The detection device according to claim 19,
wherein the amplified drive signal from the buffer circuit is output to the physical quantity transducer to drive the transducer, in a first mode, and
the drive signal from the driving circuit is output to the physical quantity transducer to drive the transducer, in a second mode.

* * * * *